(12) United States Patent  
Chinthakindi et al.

(10) Patent No.: US 7,915,134 B2  
(45) Date of Patent: Mar. 29, 2011

(54) METHOD OF INTEGRATION OF A MIM CAPACITOR WITH A LOWER PLATE OF METAL GATE MATERIAL FORMED ON AN STI REGION OR A SILICIDE REGION FORMED IN OR ON THE SURFACE OF A DOPED WELL WITH A HIGH K DIELECTRIC MATERIAL

(75) Inventors: Anil Kumar Chinthakindi, Wappingers Falls, NY (US); Douglas Duane Coolbaugh, Essex Junction, VT (US); Keith Edward Downes, Stowe, VT (US); Ebenezer E. Eshun, Wappingers Falls, NY (US); Zhong-Xiang He, Essex Junction, VT (US); Robert Mark Rassel, Colchester, VT (US); Anthony Kendall Stamper, Williston, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 561 days.

(21) Appl. No.: 11/970,555

(22) Filed: Jan. 8, 2008

(65) Prior Publication Data

US 2009/0004809 A1    Jan. 1, 2009

Related U.S. Application Data

(62) Division of application No. 11/162,471, filed on Sep. 12, 2005, now Pat. No. 7,361,950.

(51) Int. Cl.  
H01L 21/20 (2006.01)

(52) U.S. Cl. ........ 438/394; 438/393; 438/396; 438/251; 438/250

(58) Field of Classification Search .......... 438/250–256, 438/393–399  
See application file for complete search history.

(56) References Cited

U.S. PATENT DOCUMENTS

| | | | |
|---|---|---|---|
| 5,631,188 A * | 5/1997 | Chang et al. .................. 438/253 |
| 5,739,576 A | 4/1998 | Shirley | |
| 6,291,307 B1 * | 9/2001 | Chu et al. ...................... 438/393 |
| 6,706,635 B2 * | 3/2004 | Khan et al. .................... 438/692 |
| 6,724,611 B1 | 4/2004 | Mosley | |
| 6,876,028 B1 | 4/2005 | Coolbaugh et al. | |
| 6,897,510 B2 | 5/2005 | Tseng | |
| 6,940,117 B2 | 9/2005 | Coolbaugh | |
| 2003/0072126 A1 | 4/2003 | Bhattacharyya | |
| 2003/0197215 A1 | 10/2003 | Coolbaugh | |
| 2005/0067701 A1 | 3/2005 | Coolbaugh et al. | |
| 2005/0145908 A1 | 7/2005 | Moise | |
| 2005/0170598 A1 | 8/2005 | Howard | |
| 2006/0134808 A1 | 6/2006 | Summerfelt | |

* cited by examiner

*Primary Examiner* — Dung A. Le  
(74) *Attorney, Agent, or Firm* — H. Daniel Schnurmann; Graham S. Jones

(57) ABSTRACT

A MIM capacitor is formed on a semiconductor substrate having a top surface and including regions formed in the surface selected from a Shallow Trench Isolation (STI) region and a doped well having exterior surfaces coplanar with the semiconductor substrate. A capacitor lower plate is either a lower electrode formed on the STI region in the semiconductor substrate or a lower electrode formed by a doped well formed in the top surface of the semiconductor substrate that may have a silicide surface. A capacitor HiK dielectric layer is formed on or above the lower plate. A capacitor second plate is formed on the HiK dielectric layer above the capacitor lower plate. A dual capacitor structure with a top plate may be formed above the second plate with vias connected to the lower plate protected from the second plate by side wall spacers.

19 Claims, 19 Drawing Sheets

METHOD OF INTEGRATION OF A MIM CAPACITOR WITH A LOWER PLATE OF METAL GATE MATERIAL FORMED ON AN STI REGION OR A SILICIDE REGION FORMED IN OR ON THE SURFACE OF A DOPED WELL WITH A HIGH K DIELECTRIC MATERIAL

This application is a division of U.S. patent application Ser. No. 11/162,471, filed 12 Sep. 2005, issued as U.S. Pat. No. 7,361,950.

BACKGROUND OF THE INVENTION

This invention relates to a method for making a capacitor structure for high-density integrated circuits and the structure produced thereby, and more particularly relates to a method for making a Metal Insulator-Metal (MIM) capacitor having a High K (HiK) dielectric constant and the structure produced thereby.

In the semiconductor industry, currently there is a trend towards the use of metal gates for CMOS and HiK dielectric materials in high-density integrated circuit devices. This trend is based on the need to employ metal gates to reduce the problem of high leakage currents that result from device scaling to smaller and smaller dimensions as TOX (Thickness Of silicon Oxide) is reduced as the silicon oxide is thinned down for constant field scaling.

In industry, MIM capacitors are used in integrated circuits, especially those integrated circuits used in Radio frequency (RF) and other high-frequency applications. The requirement for high capacitance density/lower foot print capacitors which are compatible with ever high frequency applications has driven the industry to use HiK dielectric materials for the insulator in the MIM capacitor.

FIGS. 1A-1C are schematic sectional drawings show in three steps in the prior art process of forming a MIM capacitor 10.

FIG. 1A, the basic layers used to form the MIM capacitor 10 are shown on the top of the BEOL structure 12. First a bottom electrode 14 is formed over the BEOL structure 12 followed by formation of a MIM dielectric (MD) layer 16. The MD layer 16 is then covered by a top electrode layer 18 which in turn is covered by an etch stop layer 20. A resist mask 22 is formed over the etch stop layer 20.

FIG. 1B shows the structure 10 of FIG. 1A after the step of etching away those portions of the etch stop layer 20 and the top electrode layer 18 aside from the mask 22 by anisotropic etching down to the MD layer 16. Below the mask 22, the etch stop layer 20 has been shaped into a narrowed etch stop layer 20E and the top electrode layer 18 has been etched to form a top electrode 18E, with both, narrowed etch stop layer 20E and the top electrode layer 18 being aligned with the resist mask 22.

FIG. 1C shows the structure 10 of FIG. 1B after removal of mask 22 followed by etching of a hole extending down through the narrowed etch stop layer 20E to the top surface of the top electrode layer 18 and after etching a pair of holes through the MD layer 16 down to the top surface of the bottom electrode 14. A conductive via 25 has been formed extending down through the narrowed etch stop layer 20E to the top surface of the top electrode 18E. In addition, a dielectric layer 19 has been deposited on the structure 10. Then two conductive vias 27 have been, formed reaching down through the dielectric layer 19 and the MD layer 16 to the top surface of the bottom electrode 14 on either side of the top electrode 18E. The conductive via 25 connects to the top electrode of the BEOL MIM capacitor 10 to wire 26. The conductive vias 27 connect the bottom electrode 14 of the BEOL MIM to wire 28.

Heretofore MIM structures have been integrated into the Back End Of the Line (BEOL) structures of integrated circuit devices. However we have observed that it will eventually be impossible to integrate MIM structures into BEOL structures as the heights of Vias are reduced to smaller and smaller dimensions. Accordingly it is an object of this invention to find an alternative solution which avoids integration of MIM structures into BEOL structures.

SUMMARY OF THE INVENTION

The introduction of metal gates and HiK dielectric materials creates a demand for advanced passive device integration schemes, which will, be needed in the future to complement advanced CMOS. The integration scheme of the present invention eliminates the need for BEOL MIM integration, which will as stated above will eventually be impossible due to the reduction of Via heights. With the integration scheme of the present invention that, issue is overcome.

The present invention is an integration scheme, which uses metal gates and a HiK dielectric layer as components of MIM capacitors.

In accordance with this invention, the bottom plate of a MIM capacitor is composed of silicided polysilicon or silicon (Si) followed by deposition of a HiK dielectric layer and top plate in post silicide processing.

The main idea uses a metal gate and HiK dielectric to make a MIM capacitor as part of the CMOS integration.

A first advantage of use of a metal gate and HiK dielectric to make a MIM capacitor includes provision of a capacitor compatible with metal/HiK gate CMOS integration. A second advantage is that the MIM capacitor produced has better linearity as compared to the current MOS capacitors and hence a better RF device is produced. Thirdly, the use of the HiK dielectric layer in the MIM capacitors provides high capacitance density which is suitable for both decoupling and RF capacitors. In addition, there is no need for BEOL MIM integration, which is increasingly difficult with each new generation of integrated circuit devices because of the requirement of reduction of the via height.

The invention and objects and features thereof will be more readily apparent from the following detailed description and appended claims when taken with the drawings.

Several embodiments of this invention are explained and described below with reference to the accompanying drawings.

DESCRIPTION OF THE PREFERRED EMBODIMENTS

Processing Steps to Form Ancillary Structures for Preferred Embodiments

FIGS. 2A-2F are schematic sectional views which show a semiconductor device 30 in an early stage of manufacturing thereof in preparation for formation of the seven embodiments of this invention shown in FIGS. 3A, 4A, 5A, 6A, 7A, 8A and 9A.

Figure 1A:
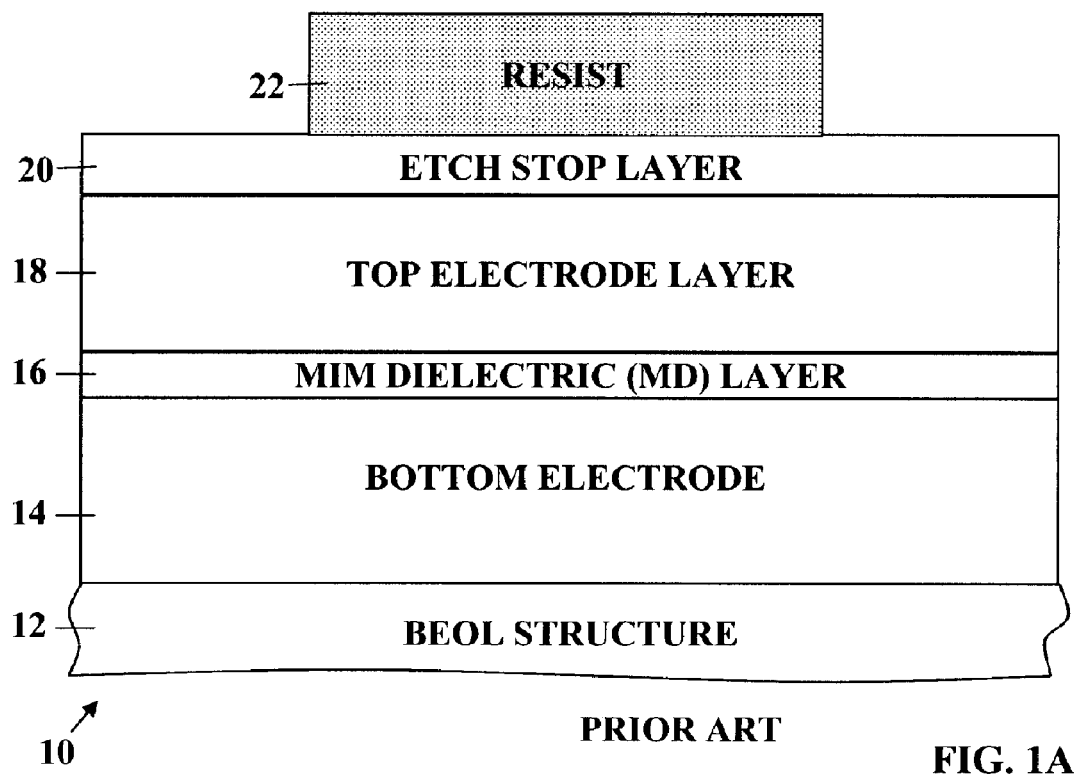
FIGS. 1A-1C are schematic sectional drawings show in three steps in the prior art process of forming a MIM capacitor.
Figure 1B:
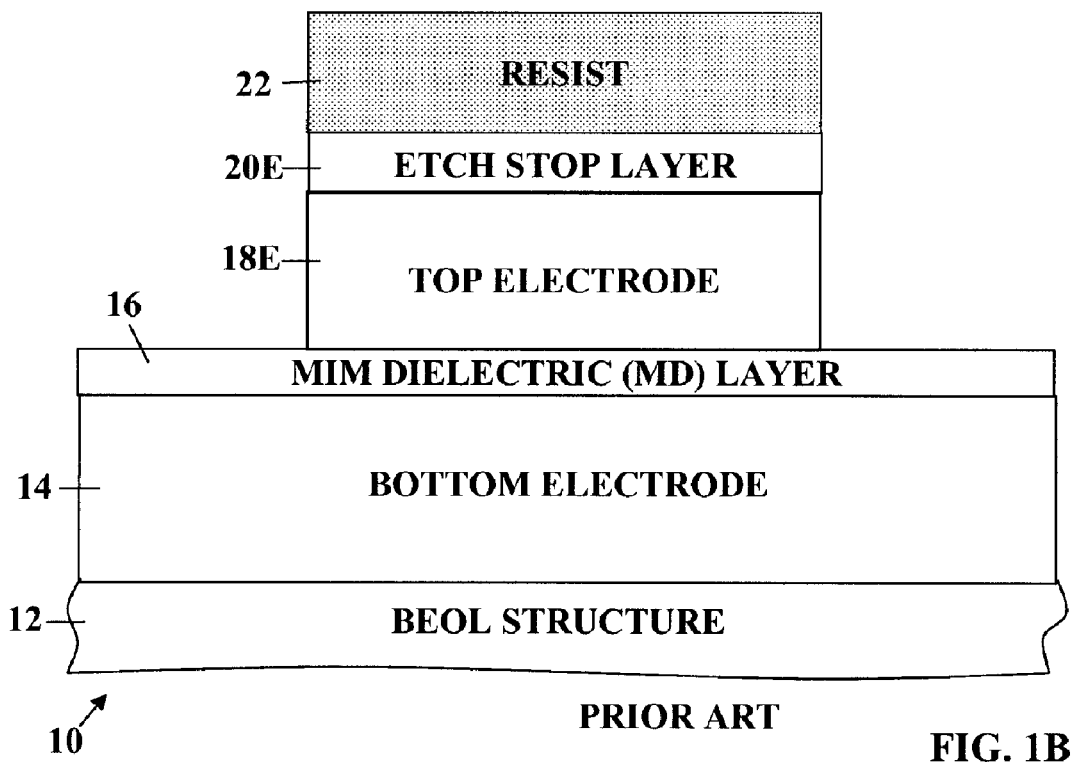
Figure 1C:
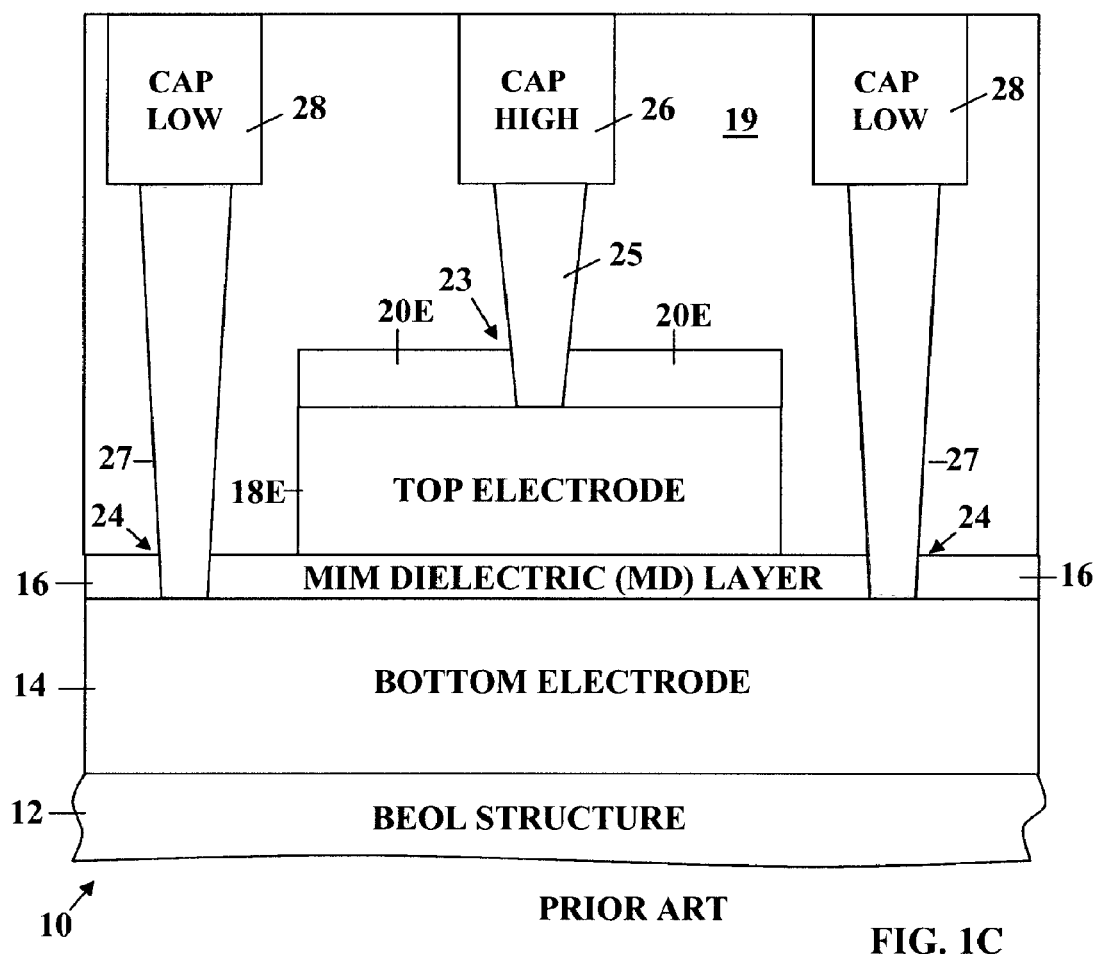
Figure 2A:
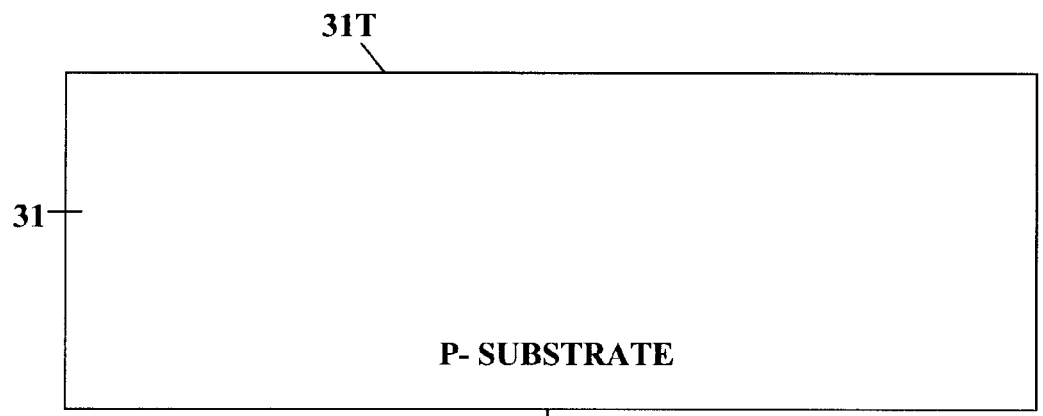
FIGS. 2A-2F are schematic sectional views which show a semiconductor device in an early stage of manufacturing in preparation for formation of the seven embodiments of this invention shown in FIGS. 3A, 4A, 5A, 6A, 7A, 8A and 9A.

FIG. 2A shows the semiconductor device 30 comprising a P-doped semiconductor substrate 31 in an initial stage of manufacturing in step 70 in the flow charts of FIGS. 3B, 4B, 5B, 6B, 7B, 8B, and 9B. Semiconductor substrate 31 has a planar top surface 31T and a bottom surface 31B.

Figure 2B:
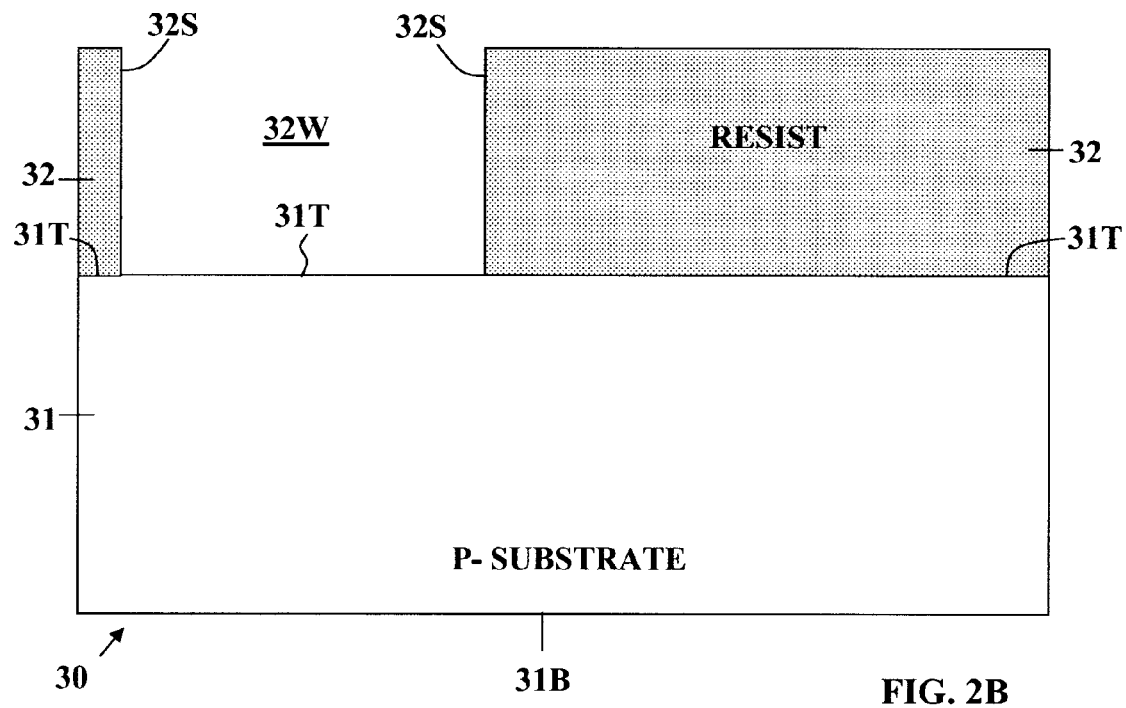

FIG. 2B shows the semiconductor device 30 of FIG. 2A after formation of a patterned mask layer 32 on the planar to surface 31T. The patterned mask layer 32 has a window 32W extending therethrough down to expose a portion of the left side of the top surface 31T of the P-doped semiconductor substrate 31 in step 71 in the flow charts of FIGS. 3B, 4B, 5B, 6B, 7B, 8B, and 9B. The window 32W in the mask layer 32 has substantially vertical sidewalls 32S extending from the top to the bottom, of the mask layer 32.

Figure 2C:
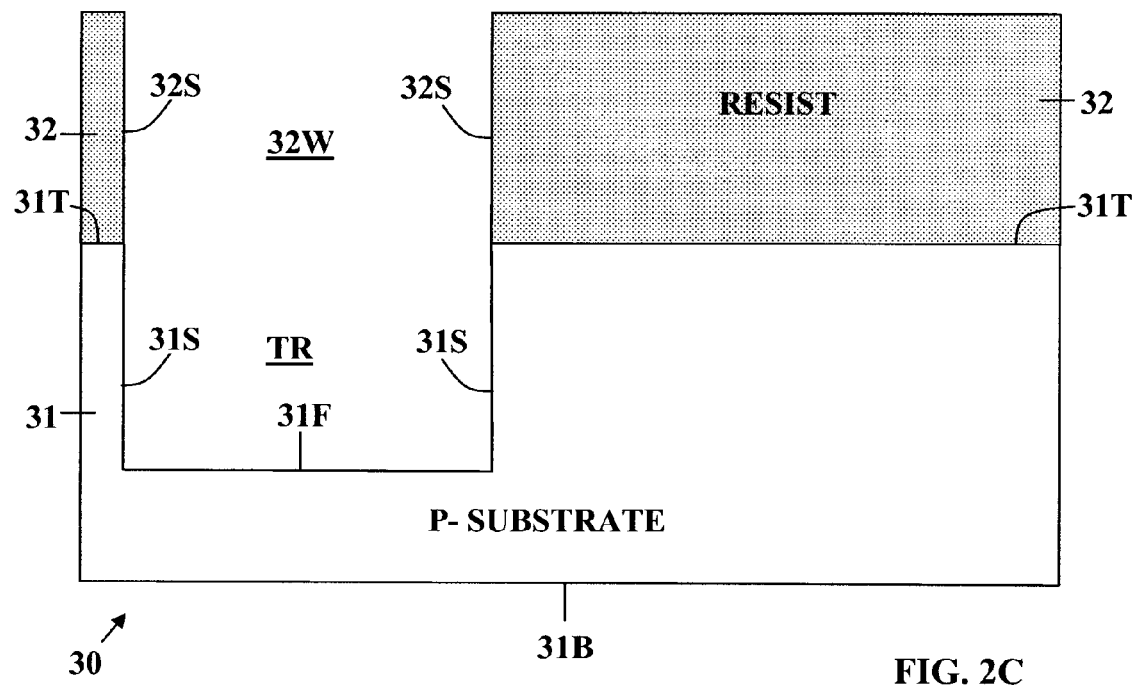
Figure 2D:
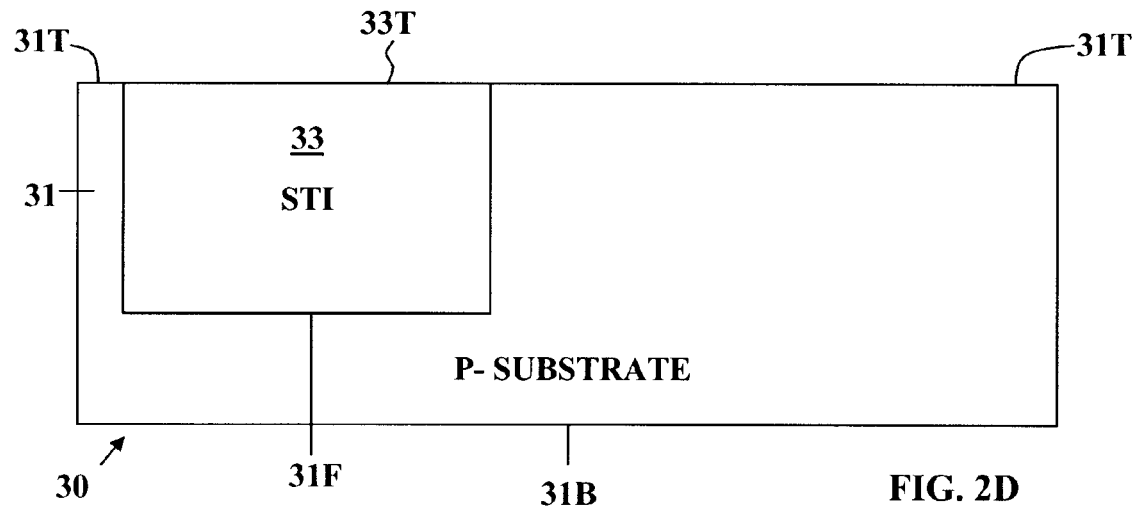

FIGS. 2C-2D show the semiconductor device 30 of FIG. 2B illustrating the processing step performed in step 72 in the flow charts of FIGS. 3B, 4B, 5B, 6B, 78, 8B, and 9B.

In FIG. 2C, a shallow trench 31TR is shown having substantially vertical sidewalls 31S etched into P-doped semiconductor substrate 31 by etching through the window 32W through the resist mask layer 32 down through the top surface 31T of the P-doped semiconductor substrate 31. Preferably a space remains between the foot 31F of the trench TR and the bottom 31B of the semiconductor substrate 31. In FIG. 2C the sidewalls 31S of the trench TR are shown aligned with the sidewalks 32S of the window 32W in the mask layer 32.

FIG. 2D shows the semiconductor device 30 of FIG. 2C after the resist, mask layer 32 was stripped and a Shallow Trench Isolation (STI) region 33 was formed by deposition of silicon dioxide filling the trench TR. The STI region 33 has been planarized to the level of the top surface of silicon substrate 31 leaving the top surface 33T of the STI region 33 in substantially the same plane as the top surface 31T of the semiconductor substrate 31.

Figure 2E:
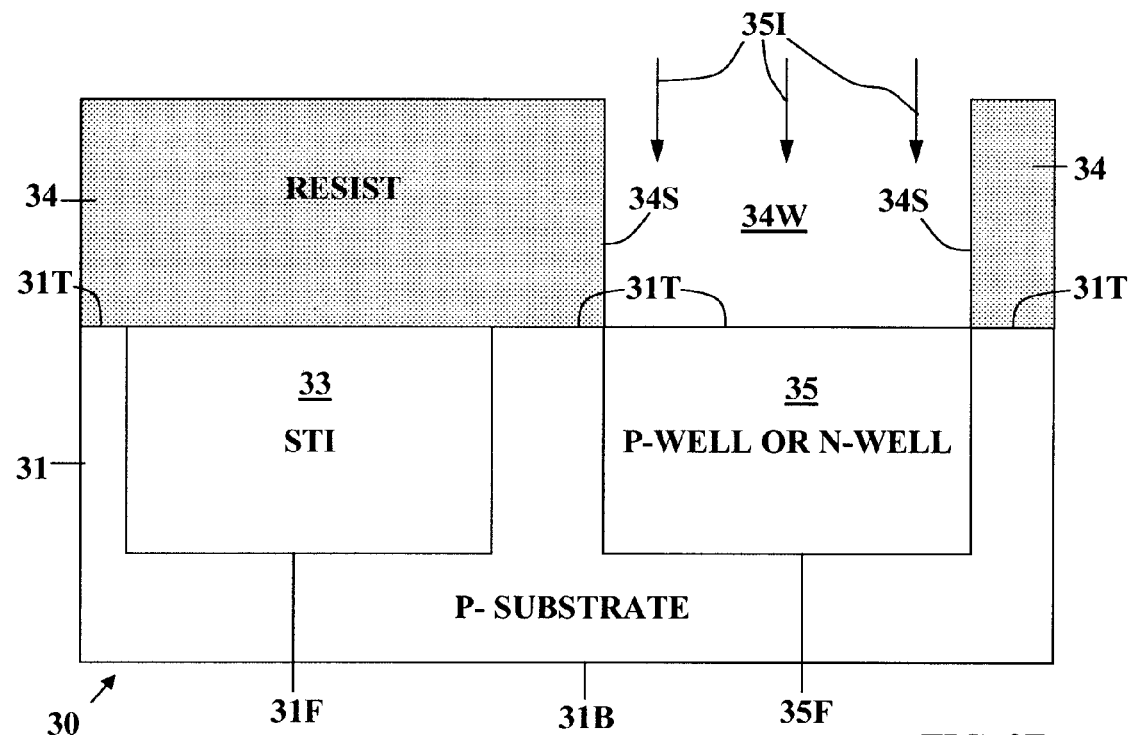
Figure 3A:
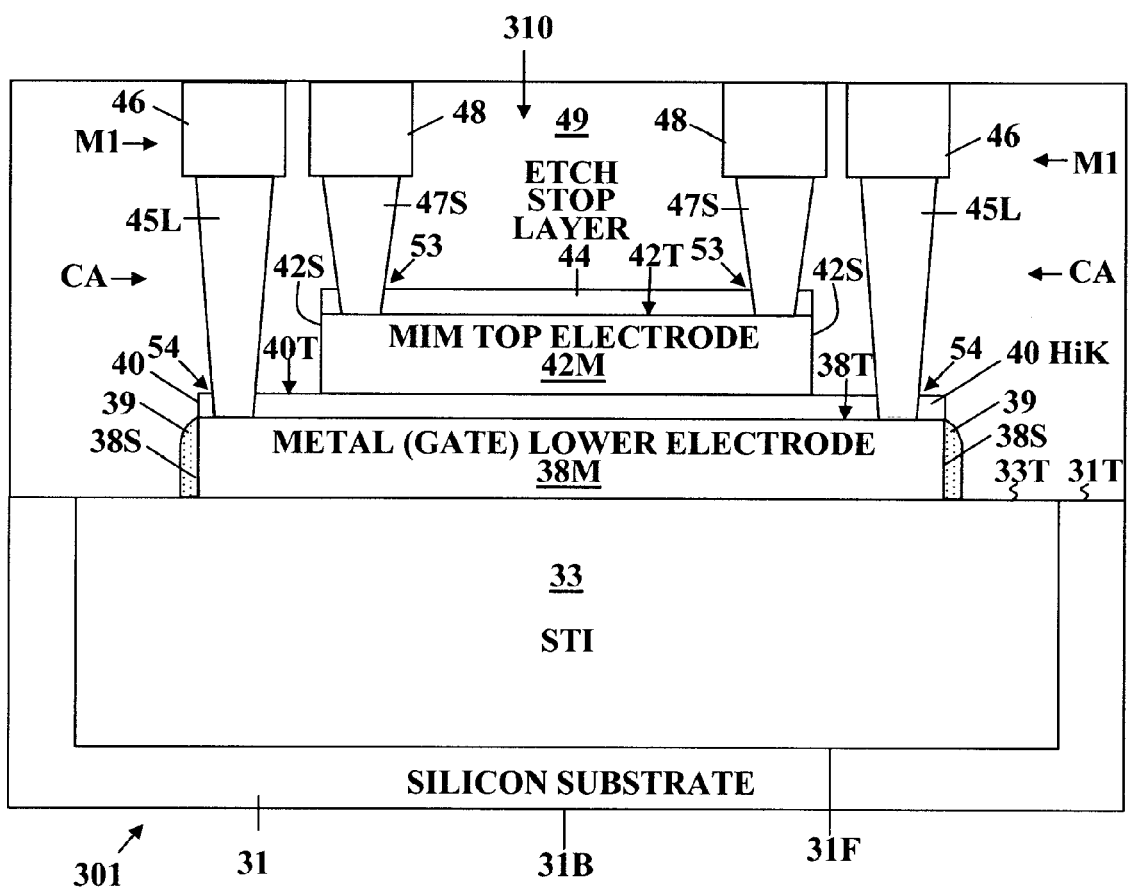
FIG. 3A is schematic sectional view of a semiconductor device in accordance with a first embodiment of this invention.
Figure 3B:
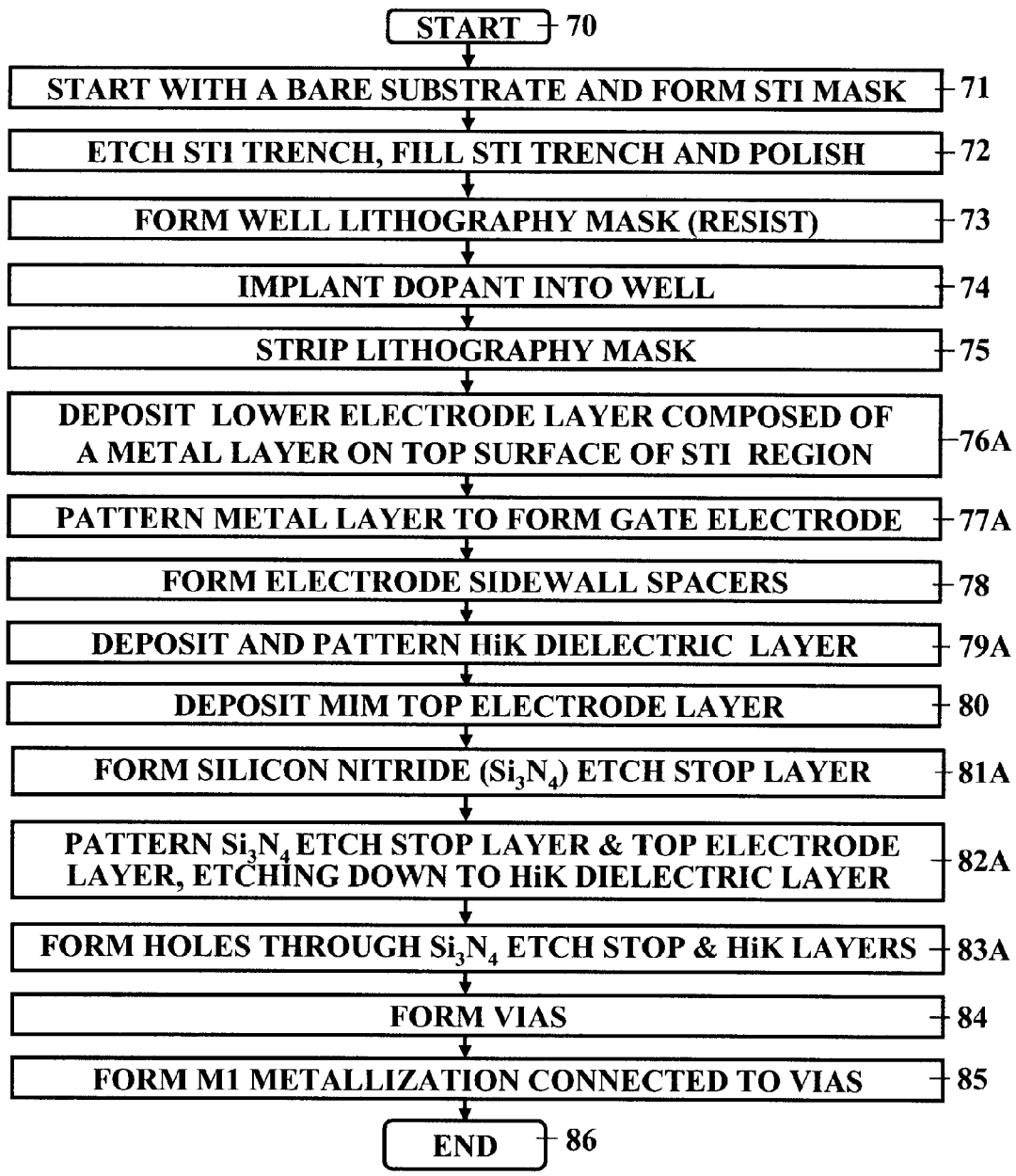
FIG. 3B is a flow chart of the process of manufacturing of the semiconductor device of FIG. 3A in accordance with the method of this invention.

FIG. 2E shows the semiconductor device 30 of FIG. 2D after the process steps 73 and 74 of FIG. 3B of forming a second mask layer 34 patterned as a well implant mask formed over the semiconductor device 30. The second mask layer 34 includes a window 34W with sidewalks 34S extending through the second mask layer 34 down to the top surface of a portion of the right side of the P-doped semiconductor substrate 31. FIG. 2E shows the ion implantation of ions 351 through the window 34W thereby forming a P-doped well or N-doped well 35 in the P-substrate 31. The well 35 has a floor 35F spaced above the bottom 31B of the semiconductor substrate 31. The doped well 35 is aligned with the window 34W in the mask 34. FIG. 2E illustrates the processing performed in steps 73 and 74 in the flow charts of FIGS. 3B, 4B, 5B, 6B, 7B, 8B, and 9B.

Figure 2F:
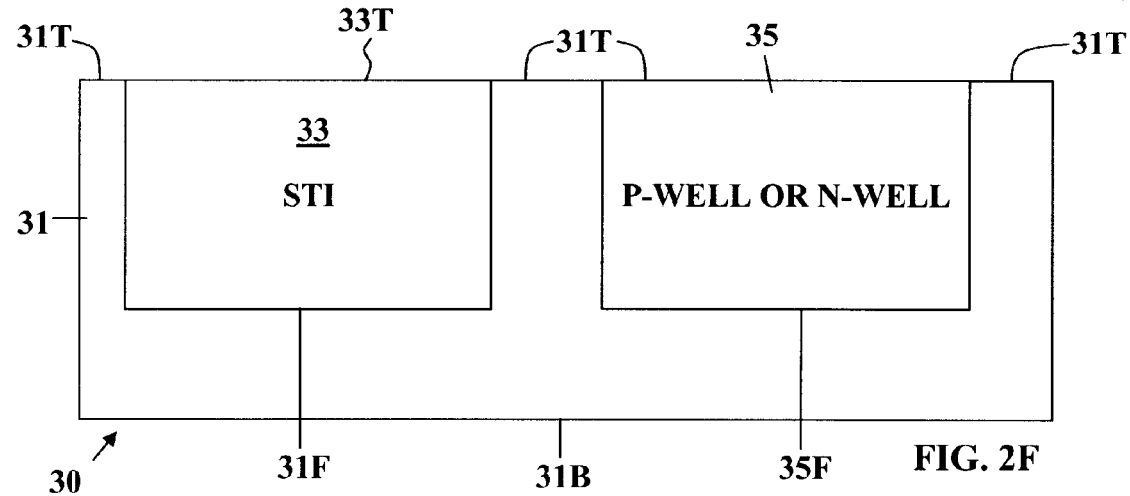

FIG. 2F shows the semiconductor device 30 of FIG. 2E after removing the second mask layer 34, leaving the semiconductor device with the STI region 33 on the left and the doped well 35 on the right. There are several different structures comprising embodiments of this invention which can be formed over either the STI region 33 or the doped well 35 which are described below. FIG. 2F illustrates the processing performed in step 75 in the flow charts of FIGS. 3B, 4B, 5B, 6B, 7B, 8B, and 9B.

First Embodiment

FIG. 3A is schematic sectional view of a semiconductor device 301 including a Metal Insulator-Metal (MIM) capacitor 310 in accordance with this invention. The semiconductor device 301 is manufactured according to the process of this invention, as shown by the flow chart of FIG. 3B.

The Metal Insulator-Metal (MIM) capacitor 310 is formed on a base comprising a semiconductor substrate 31 having a top surface 31T. A Shallow Trench isolation (STI) region 33 is formed in the region of the surface 31T of the substrate 31. The STI region 33 has a top surface 33T coplanar with the top surface 31T of the semiconductor substrate 31. The MIM capacitor lower plate 38M is a metal electrode formed on the top surface 33T of the STI region 33. A HiK dielectric layer 40 of the MIM capacitor 310 is formed on the top surface 38T of the lower plate 38M of the MIM capacitor 310. The MIM capacitor top plate 42M is formed on the HiK dielectric layer 40 above the lower plate 38M. An etch stop layer 44 is formed above the top plate electrode 42M.

The semiconductor device 301 of FIG. 3A is formed on the STI portion of the semiconductor device 30 of FIG. 2F alter completion of manufacturing steps of FIG. 3B performed on the STI region 33 of the P-doped semiconductor substrate 31 manufactured in accordance with the steps 76A-86 shown in the flow chart of FIG. 3B.

FIG. 3B shows the sequence of manufacturing the semiconductor device 301 of FIG. 3A including at least the process steps 70, 71 and 72 shown in FIGS. 2A-2E. The semiconductor device 301 is formed on the top surface 33T of the STI region 33 (with or without the N doped or P doped well region 35 formed in steps 73, 74 and 75 of FIG. 3B.)

As indicated above, the semiconductor device 301 has been formed over the top surface 33T of the STI region 33 in the semiconductor substrate 31 of FIG. 2E. Deposition step 76A has been performed resulting in the formation of a blanket metal layer 38M covering the top surface 33T of the STI region 33 of the device 301 and the top surface 31T of the STI region 33. The metal layer 38M comprises a gate electrode layer, e.g. a polysilicon doped gate electrode layer or a metal layer which is to be formed into the lower plate of the MIM capacitor 310.

In step 77A of FIG. 3B, the metal (gate) lower electrode 38M is patterned to lie well within the borders of the STI region 33 (on the top surface 33T thereof) leaving a margin thereabout so that the electrode 38M does not contact the top surface 31T or any other part of the silicon substrate 31 aside from the STI region 33. In other words, the sidewalk 38S of the electrode 38M are spaced away from, the exposed top surface 31T of the silicon substrate 31. The processing can be the conventional process for forming Metal gates of MOSFET devices, as is well understood by those skilled in the art.

In step 78 of FIG. 3B, sidewall spacers 39 composed of a dielectric material such as silicon dioxide ($SiO_2$) are formed on the sidewalks 38S of the metal (gate) lower electrode 38M.

In step 79A of FIG. 3B, a blanket HiK dielectric layer 40 composed of a High-K dielectric material, i.e. $Ta_2O_5$, $BaTiO_3$, $HfO_2$, $ZrO_2$ or $Al_2O_3$, is deposited on the top surface 31T of the patterned metal (gate) lower electrode layer 38M, the spacers 39 and the exposed portions of the top surface 33T of the STI region 33 and the silicon substrate 31T to form the High-K dielectric 40 for the MIM capacitor 310 which is being formed. Then a patterning mask (not shown) is formed over the blanket HiK dielectric layer 40 and the unwanted portions of HiK dielectric layer 40 are removed re-exposing the portions of the top surface 33T of the STI region 33 and the top surface 31T of the silicon substrate 31 which had been exposed after step 78.

In step 80, FIG. 3B a blanket MIM fop electrode layer 42M of the MIM capacitor 310 is deposited on the semiconductor device 301. The layer 42M covers the exposed surfaces of the device 301 at that stage in the process of formation thereof. The top electrode layer 42M may be composed of a material selected from the group consisting of TiN, Ti, Ta, TaN, and W or a combination thereof in all embodiments.

In step 81A of FIG. 3B, deposit a blanket silicon nitride ($Si_3N_4$) etch stop layer 44 on the top surface of the blanket MIM top electrode layer 42M.

In step 82A of FIG. 3B, form a patterning mask (not shown) and pattern the $Si_3N_4$ etch stop layer 44 and the MIM top electrode layer 42, etching down therethrough stopping at the top surface 40T of the HiK dielectric layer 40, the exterior surfaces of the sidewall spacers 39, the top surface 33T of the STI region 33 and the top surface 31T of the silicon substrate 31. The patterning mask of step 82A was designed so narrow the etch stop layer 44 and the MIM top electrode 42 with sidewalls 42S so that they are narrower than the stack comprising the HiK dielectric layer 40 and the metal lower electrode 38M. In that way room remains for formation of electrical contacts from above extending through the HiK dielectric layer 40 to the metal gate electrode 38M.

Then in accordance with the conventional step 83A in FIG. 3B, form shallow via holes 53 and deep via holes 54 extending down through the silicon nitride ($Si_3N_4$) etch stop layer 44 and the HiK dielectric layer 40 by patterning the blanket dielectric layer 49, the silicon nitride ($Si_3N_4$) etch stop layer 44 and the HiK dielectric layer 40. The via holes 53 and 54 are formed by first forming a blanket deposit of a dielectric layer 49 composed of a material such as BSPG (not shown for convenience of illustration.) Then a via mask is formed and deep via holes 54 are formed extending through the blanket dielectric layer 49 and through the lateral portion of HiK dielectric layer 40 aside from MIM top electrode 42M 54 located between sidewalls 38S and 42S extending down to the top surface 38T of the metal (gate) lower electrode 38M. In addition the shallow via holes 53 formed between the sidewalls 38S of the MIM top electrode 42M extend through layer 49 and etch stop layer 44 down into contact with the top surface 42T of the MIM top electrode 42M.

Then in accordance with the conventional via formation step 84 in FIG. 3B, a short pair of vias 47S are formed in the shallower set of via holes 53 extending down to the top surface 42T of the electrode layer 42M. A long set of vias 45L are formed in the deep set of via holes 54 extending down to the top surface of the metal lower electrode 38M.

In step 85, M1 metallization element is formed above the vias 45L/47S. Metallization elements 48 and 46 are formed over short vias 47S and long vias 45L respectively.

Finally, step 86 ends the process shown by FIG. 3B.

Second Embodiment

Figure 4A:
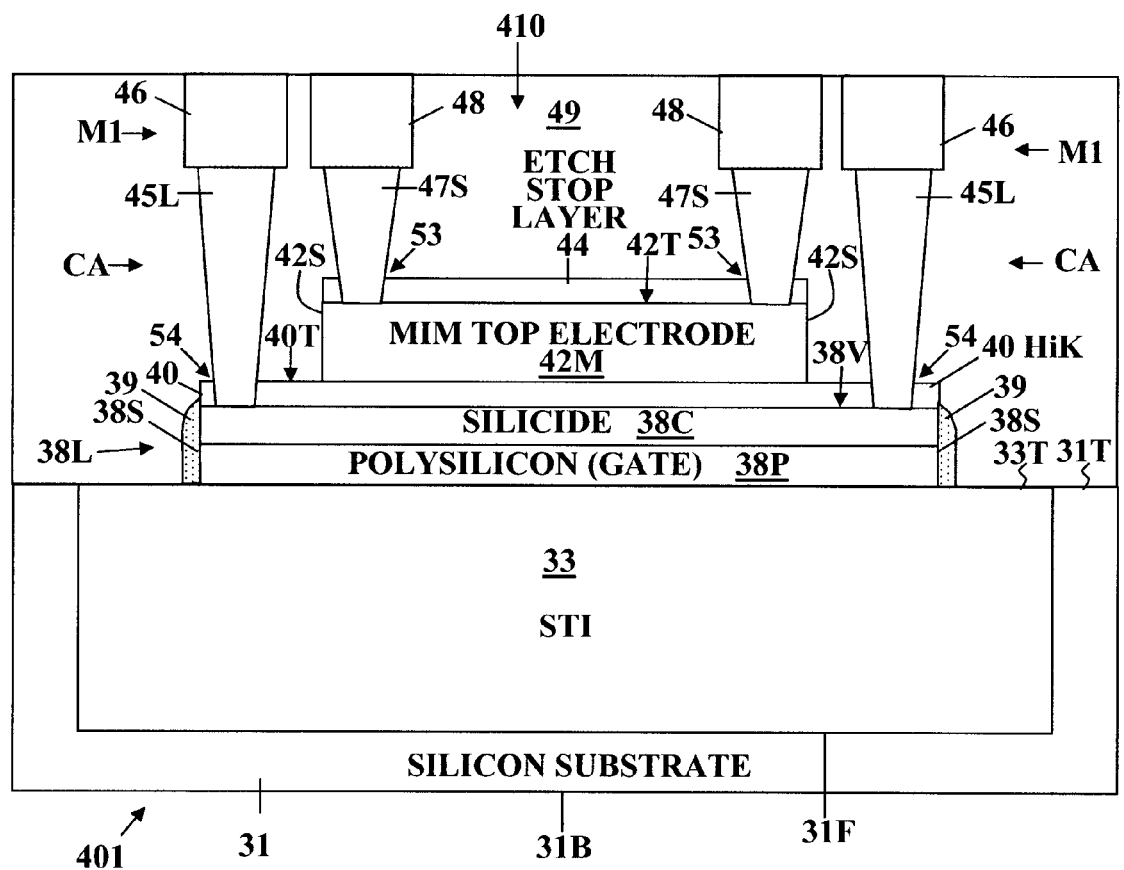
FIG. 4A is schematic sectional view of a semiconductor device in accordance with a second embodiment this invention.

FIG. 4A is schematic sectional view of a semiconductor device 401 in accordance with this invention including a Metal Insulator-Metal (MIM) capacitor 410. The semiconductor device 401 is manufactured in accordance with the process of this invention which is shown by the flow chart of FIG. 4B.

As shown in FIG. 4A the MIM capacitor 410 is formed on a base comprising a semiconductor substrate 31 having atop surface 31T with an STI region 33 formed in a region of the surface 31T of the substrate 31. Moreover, also as in FIG. 3A the STI region 33 has a top surface 33T coplanar with the top surface 31T of the semiconductor substrate 31. In the case of FIG. 4A, however, the MIM capacitor 410 has a silicided lower plate 38L. A portion 38P of the silicided lower plate 38L is a conductive (doped) polysilicon layer 38P formed on the top surface 33T of the STI region 33. The complementary portion of the laminated lower plate 38L is a conventional conductive (doped) silicide layer 38C (formed in step 184 in FIG. 4B) in the top surface of the polysilicon layer 38P, as will be well understood by those skilled in the art. A capacitor HiK dielectric layer 40 is formed on the top surface 38V of the silicide layer 38C of the MIM capacitor lower plate 38M. The top plate 42M of the MIM capacitor is formed on the top surface 40T of the HiK dielectric layer 40 above the MIM capacitor laminated lower plate 38L. An etch stop layer 44 is formed above the top plate electrode 42M.

Figure 4B:
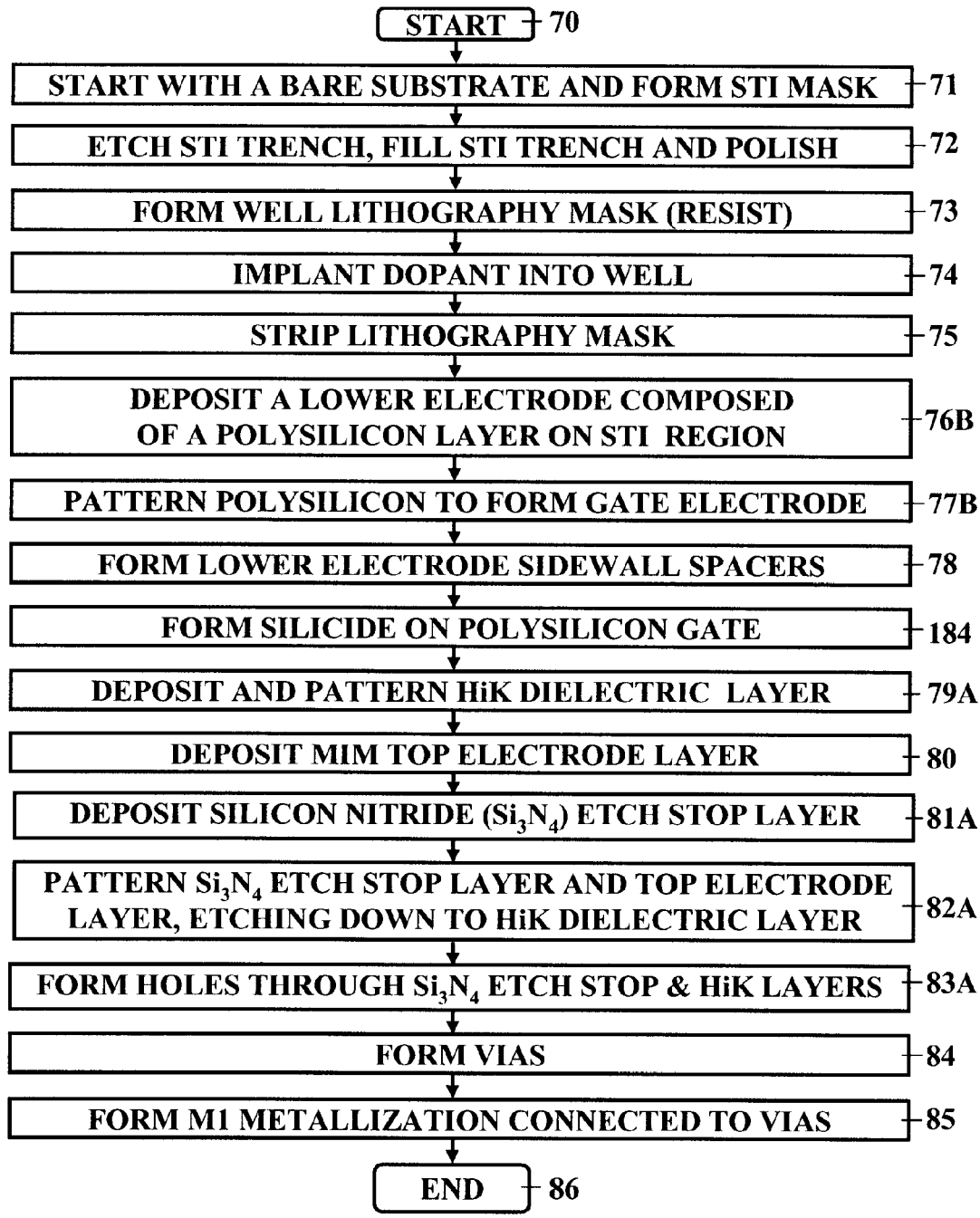
FIG. 4B is a flow chart of the process of manufacturing of the semiconductor device of FIG. 4A in accordance with the method of this invention.

In detail FIG. 4A shows a semiconductor device 401 which is a portion of the semiconductor device 30 of FIG. 2F in a later stage of manufacturing comprising a P-doped semiconductor substrate 401 manufactured in accordance with the steps 76B-86 shown in the flow chart of FIG. 4B. FIG. 4B shows the sequence for manufacturing the semiconductor device 401 including at least the process steps 70, 71 and 72 shown in FIGS. 2A-2E. The semiconductor device 401 is formed on the top surface 33T of the STI region 33 (with or without the N doped or P doped well region 35 formed in steps 73, 74 and 75 of FIG. 4B.)

As indicated above, the semiconductor device 401 has been formed over the top surface 33T of the STI region 33 in the semiconductor substrate 31 of FIG. 2E. In deposition step 76B, a blanket polysilicon layer 38P is deposited covering the top surfaces 33T of the STI region 33 and the surface 31T of the substrate 31 of device 401. The polysilicon layer 38P may comprise a gate electrode layer, e.g. a poly silicon doped gate electrode layer.

In step 77B of FIG. 4B, the blanket polysilicon layer 38P of the lower plate 38L (i.e. blanket polysilicon layer 38P and silicide layer 38C) has been patterned by masking and etching to lie well within the borders of the STI region 33 (on the top surface 33T thereof) leaving a margin thereabout so that patterned lower plate 38L does not contact the top surface 31T or any other part of the silicon substrate 31 aside from the STI region 33. In other words, the sidewalls 38S of the polysilicon layer 38P of the lower plate 38L are spaced away from the exposed top surface 31T of the silicon substrate 31. The processing can be the conventional process for forming Metal gates of MOSFET devices, as will be well understood by those skilled in the art.

In step 78 of FIG. 4B, sidewall spacers 39 composed of a dielectric material such as silicon dioxide ($SiO_2$) are formed on the sidewalls 38S of the lower plate 38L.

In step 184 of FIG. 4B, a silicidation process is performed forming a silicide layer 38C in the upper surface of the poly silicon layer 38 creating the lower plate 38L with sidewalls 38S and sidewall spacers 39 extending to the top of the silicide layer 38C as shown in FIG. 4A.

In step 79A of FIG. 4B, a blanket HiK dielectric layer 40 composed of a High-K dielectric material, i.e. $Ta_2O_5$, $BaTiO_3$, $HfO_2$, $ZrO_2$ or $Al_2O_3$, is deposited on the top surface 38V of the silicide layer 38C, the spacers 39 and the exposed portions of the top surface 33T of the STI region 33 and the top surface 31T of the silicon substrate 31 to prepare for formation of the High-K dielectric of the MIM capacitor 410. Then a patterning mask (not shown) is formed over the blanket HiK dielectric layer 40 and the unwanted portions of HiK dielectric layer 40 are removed re-exposing the portions of the top surface 33T of the STI region 33 and the top surface 31T of the silicon substrate 31 which were exposed after step 78 leaving a patterned HiK dielectric layer 40 for the MIM capacitor 410.

In step 80, FIG. 4B a blanket MIM top electrode layer 42M of the MIM capacitor 410 is deposited on the semiconductor device 301 covering the exposed surfaces thereof at that stage in the process of formation thereof.

In step 81A of FIG. 4B, a blanket silicon nitride ($Si_3N_4$) etch stop layer 44 is deposited on the top surface of the blanket MIM top electrode layer 42M.

In step 82A of FIG. 4B, form a patterning mask (not shown) and pattern the $Si_3N_4$ etch stop layer 44 and the MIM top electrode layer 42, etching down therethrough stopping at the top surface 40T of the HiK dielectric layer 40, the exterior surfaces of the sidewall spacers 39, the top surface 33T of the STI region 33 and the top surface 31T of the silicon substrate 31. The patterning mask of step 82A was designed so that the etch stop layer 44 and the MIM top electrode 42 with sidewalls 42S are narrower than the stack comprising the HiK dielectric layer 40 and the metal lower electrode 38M. In that way room remains for formation of electrical contacts from above extending through the HiK dielectric layer 40 to the top surface 38V of the silicide layer 38C.

Then in accordance with the conventional step 83A in FIG. 4B, form shallow via holes 53 and deep via holes 54 extending down through the silicon nitride ($Si_3N_4$) etch stop layer 44 and through the HiK dielectric layer 40 by patterning the blanket dielectric layer 49, the silicon nitride ($Si_3N_4$) etch stop layer 44 and the HiK dielectric layer 40. The via holes 53 and 54 are formed by first forming a blanket deposit of a dielectric layer 49 composed of a material such as BSPG (not shown for convenience of illustration.) Then a via mask is formed and the deep via holes 54 are formed extending through the blanket dielectric layer 49 and through the lateral portion of HiK dielectric layer 40 aside from MIM top electrode 42M located between sidewalls 38S and 42S extending down to the top surface 42T of the silicide layer 38C. In addition the shallow via holes 53 are formed between the sidewalls 38S of the MIM top electrode 42M extending through layer 49 and etch stop layer 44 into contact with the top surface 42T of the MIM top electrode 42M.

Then in accordance with the conventional via formation step 84 in FIG. 4B, a short pair of vias 47S are formed in the shallower set of via holes 53 extending down to the top surface 42T of the MIM top electrode 42M. A long set of vias 45L are formed in the deep set of via holes 54 extending down to the top surface of the silicide layer 38C.

In step 85, M1 metallization elements 46/48 are formed above the vias 45L/47S.

Step 86 ends the process shown by FIG. 4B.

Third Embodiment

Figure 5A:
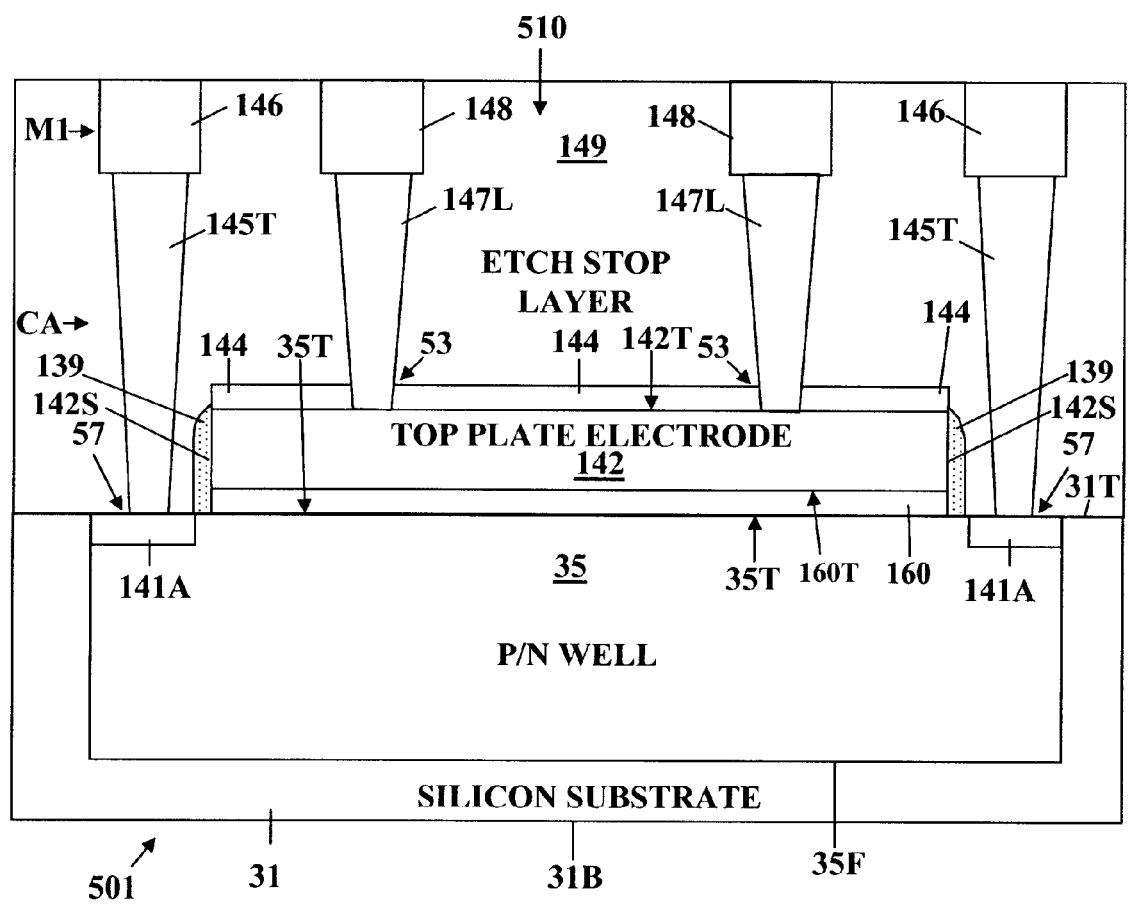
FIG. 5A is schematic sectional view of a semiconductor device in accordance with a third embodiment of this invention.

FIG. 5A is schematic sectional view of a semiconductor device 501 including a Metal Insulator-Metal (MIM) capacitor 510 in accordance with this invention. The semiconductor device 501 is manufactured according to the process of this invention shown by the flow chart of FIG. 5B.

As shown in FIG. 5A the MIM capacitor 510 is formed on a base comprising a semiconductor substrate 31 having a top surface 31T. A P/N (Positively or Negatively) doped well 35 is formed in a region of the surface 31T of the substrate 31. The P/N doped well 35, which serves as the lower plate of the MIM capacitor 510, has a top surface 35T coplanar with the top surface 31T of the P/N doped well 35 in the semiconductor substrate 31. A capacitor HiK dielectric layer 160 is formed on the top surface 35T of the doped P/N well 35. The top plate 142 of the MIM capacitor 510 is formed on the top surface 160T of the HiK dielectric layer 160 above the doped P/N well 35, i.e. the lower plate of the MIM capacitor 510. Sidewall spacers 139 composed of a dielectric material such as silicon dioxide ($SiO_2$) are formed covering the sidewalls 142S of the top plate electrode 142b and on sidewalls of said HiK dielectric layer 160. A silicon nitride ($Si_3N_4$) etch stop layer 144 is formed above the top plate electrode 142. A blanket BPSG dielectric layer 149 covers the device 501. A set of shallow via holes 53 located between the sidewalls 142S of the MIM top plate electrode 142 extend down through the blanket dielectric layer 149 and the silicon nitride ($Si_3N_4$) etch stop layer 144 to the top surface 142T of the MIM top plate electrode 142. The etch stop layer 144, the capacitor HiK dielectric layer 160, and the top plate 142 of the MIM capacitor 510 are narrower than the P/N well 35 leaving space for both sidewall spacers 139 and a set of tail, vertical vias 145T formed in an extra deep set of via holes 57 so that the vertical vias 145T extend down into electrical and mechanical contact with the top surface of a set of silicide contact pads 141A that have been formed in the top surface 35T of the P/N well 35, aside from the capacitor HiK dielectric layer 160, and the top plate 142 of the MIM capacitor 510.

In detail FIG. 5A shows a semiconductor device 401 which is a portion of the semiconductor device 30 of FIG. 2F in a later stage of manufacturing comprising a P-doped semiconductor substrate 501 manufactured in accordance with the steps 79B-86 shown in the flow chart of FIG. 5B> which show's the sequence for manufacturing the semiconductor device 501 including at least the process step 73-75 shown in FIGS. 2A-2B. Semiconductor device 501 is formed on the top surface 35T of the doped P/N well 35 (with or without the STI region 33 formed in steps 71-72 in FIG. 5B.)

As indicated above, the semi conductor device 501 has been formed in and above the P/N well 35 in the semiconductor substrate 31 of FIG. 2E and above the top surface 35T thereof.

Figure 5B:
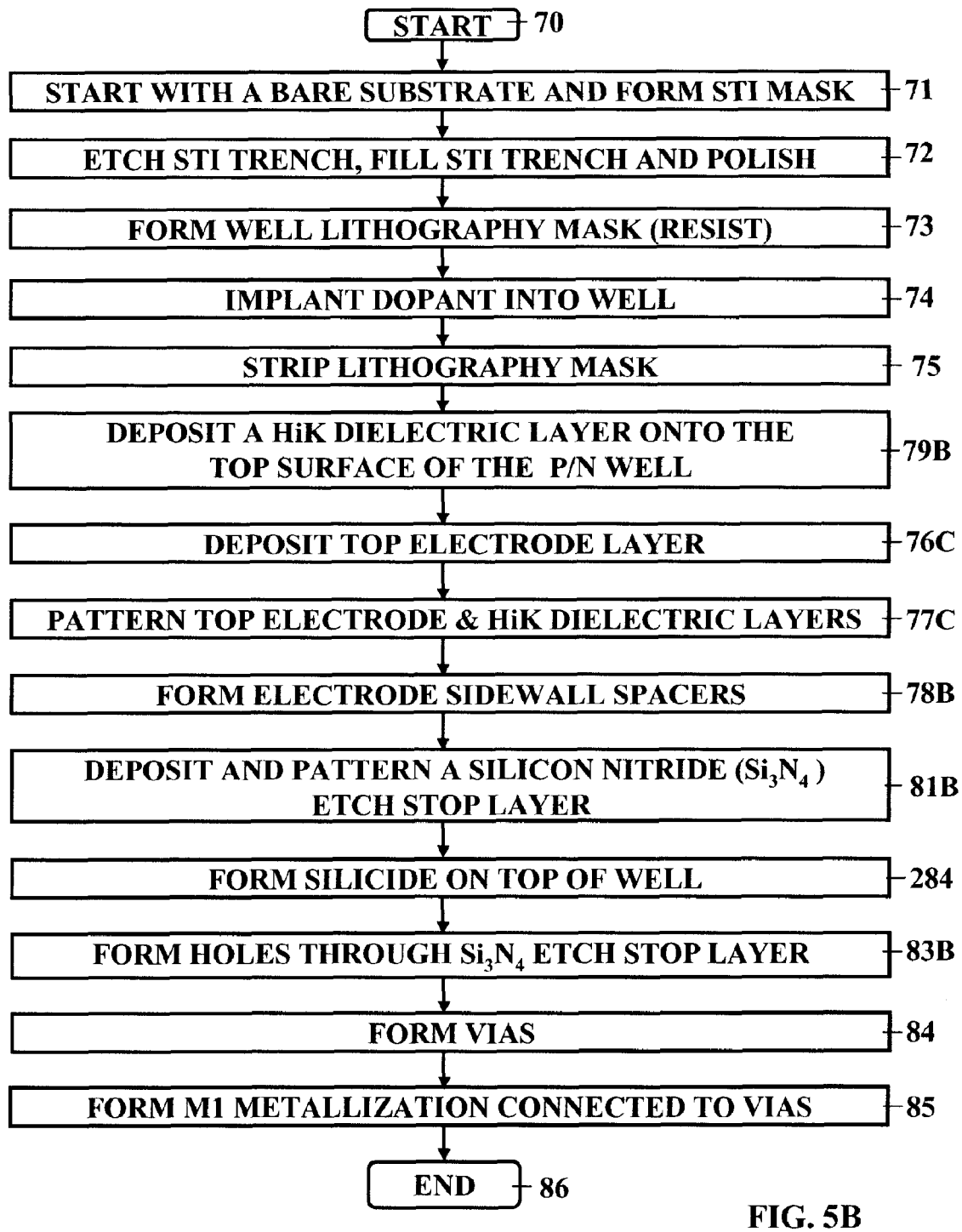
FIG. 5B is a flow chart of the process of manufacturing of the semiconductor device of FIG. 5A in accordance with the method of this invention.

In step 79B of FIG. 5B, a blanket HiK dielectric layer 160 composed of a High-K dielectric material i.e. $Ta_2O_5$, $BaTiO_3$, $HfO_2$, $ZrO_2$ or $Al_2O_3$, is deposited on the top surface 35T of the doped P/N well 35 and the top surface 31T of the silicon substrate 31 to prepare for formation of the High-K dielectric of the MIM capacitor 510. Then a patterning mask (not shown) is formed, over the blanket HiK dielectric layer 160 and the unwanted portions of HiK dielectric layer 160 are removed re-exposing the portions of the top surface 33T of the STI region 33 and the top surface 31T of the silicon substrate 31 which were exposed after step 78 leaving a patterned HiK dielectric layer 160 for the MIM capacitor 510.

In deposition step 76C, of FIG. 5B, a blanket conductive electrode layer 142 has been formed covering the dielectric layer 160 and every other exposed surface of the device in preparation for formation of the top plate electrode 142.

In step 77C of FIG. 5B the blanket conductive electrode layer 142 has been patterned by masking and etching to lie well within the borders of the P/N well 35 (above the top surface 35T thereof and above the dielectric layer 160) leaving a margin thereabout so that patterned top plate 142 does not contact the top surface 31T or any other part of the silicon substrate 31 or top surface 35T of the P/N well 35. In other words, the sidewalls 142S of the polysilicon layer 142 of the top plate 142 are spaced away from the exposed top surface 31T of the silicon substrate 31 and the top surface 35T of the P/N well 35. The processing can be the conventional process for forming Metal gates of MOSFET devices, as will be well understood by those skilled in the art.

In step 78B of FIG. 5B, sidewall spacers 139 composed of a dielectric material such as silicon dioxide ($SiO_2$) are formed covering the sidewalls 142S of the top plate electrode 142.

In step 81B of FIG. 58, a blanket silicon nitride ($Si_3N_4$) etch stop layer 144 is deposited on the top surface of the blanket MIM top electrode layer 142 and patterned to be aligned with the top plate electrode 142, leaving at least a portion of the periphery of the top surface 35T of the P/N well 35 and the top surface 31T of the substrate 31 exposed.

In step 284 of FIG. 5B, a silicidation process is performed to create one or more silicide contact pads 141A in the top surface 35T of the P/N well 35 extending from the spacers 139 across the previously exposed top surface 35T of the P/N well 35 to the top surface 31T of the substrate 31.

Then in a conventional step 83B in FIG. 5B, after a blanket dielectric layer 149 was formed over the device 501, a set of shallow via holes 53 is formed extending down through the silicon nitride ($Si_3N_4$) etch stop layer 144 by patterning the blanket dielectric layer 149 and the silicon nitride ($Si_3N_4$) etch stop layer 144. Extra deep via holes 57 are formed reaching down to the silicide contact pads 141A. The via holes 53 and 54 are formed by first forming the blanket deposit of the dielectric layer 149 composed of a material such as BSPG (not shown for convenience of illustration.) Then a via mask is formed and the extra deep via holes 57 are formed extending through the blanket dielectric layer 149 extending down to the top surface of the silicide layer 141A. In addition the shallow via holes 53 axe formed between the sidewalls 142S of the MIM top plate electrode 142 extending through layer 149 and etch stop layer 144 into contact with the top surface 142T of the MIM top plate electrode 142.

Then in accordance with the conventional via formation step 84 in FIG. 58, a short pair of vias 147L are formed in the shallower set of via holes 53 extending down to the top surface 142T of the MIM top plate electrode 142. A tall set of vias 145T are formed in the deep set of via holes 57 extending down to the top surface of the silicide layer 141A.

Finally in step 85, M1 metallization elements 146/148 are formed above the vias 145T/147L.

Step 86 ends the process shown by FIG. 5B.

Fourth Embodiment

Figure 6A:
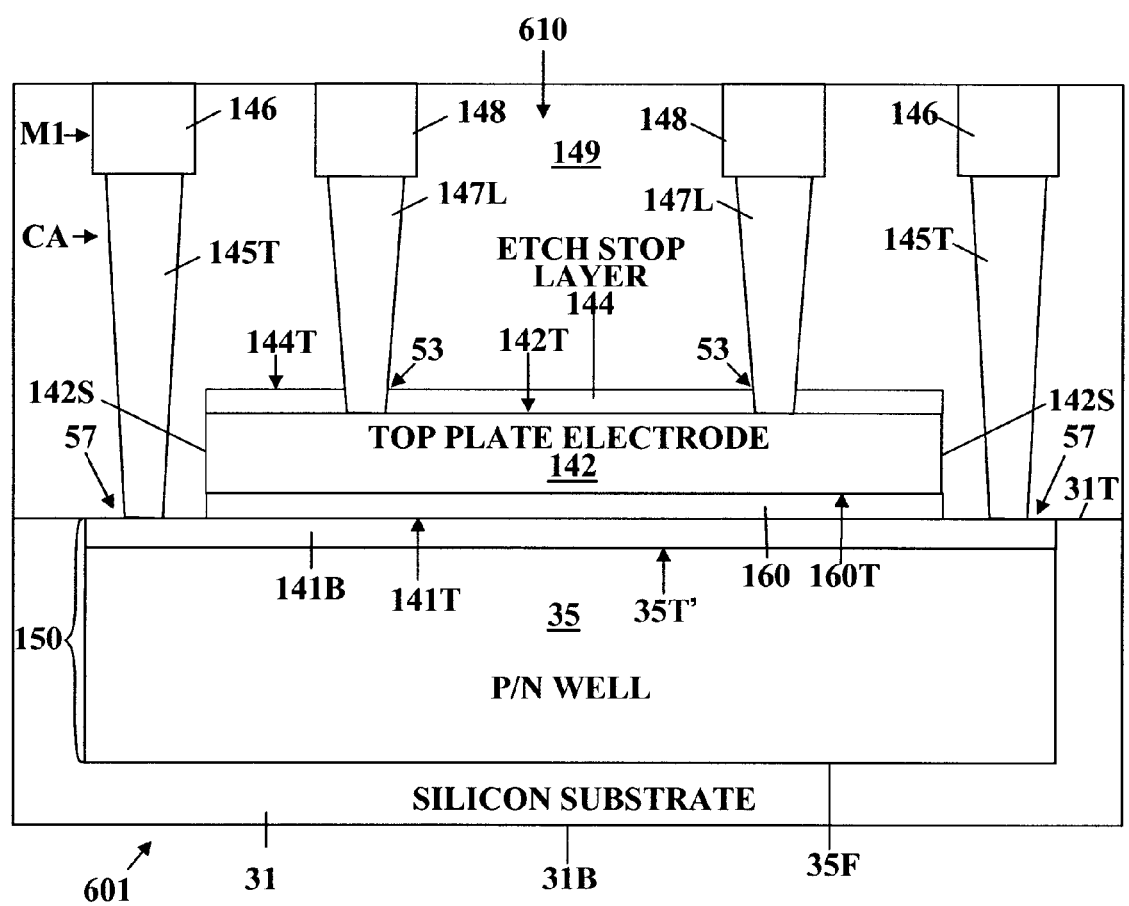
FIG. 6A is schematic sectional view of a semiconductor device in accordance with a fourth embodiment this invention.

FIG. 6A is schematic sectional view of a semiconductor device 601 including a MIM capacitor 610 in accordance with this invention. The semiconductor device 601 is manufactured in accordance with the process of this invention shown by the flow chart of FIG. 6B.

In the embodiment of FIG. 6A, a lower plate 150 of the MIM capacitor 610 comprises the combination of the doped well 35 with a silicide layer 141B formed in the entire top surface of the P/N well 35. A HiK dielectric layer 160 is formed on the top surface of the silicide layer 141B above doped well 35 and silicide layer 141B. The top plate electrode 142 of the MIM capacitor 610 is formed on the top surface 160T of the HiK dielectric layer 160. The top plate 142 of the dual MIM capacitor 610 is formed with sidewalls 142S well inside of the location of the periphery of the silicide layer 141B and the P/N well 35.

As shown in FIG. 6A the MIM capacitor 610 is formed on a base comprising a semiconductor substrate 31 having a top surface 31T. A P/N well 35 is formed in a region of the surface 31T of the substrate 31. As in FIG. 5A, the P/N well 35 originally had a fop surface coplanar with the top surface 31T of the semiconductor substrate 31, but a silicide layer 141B has been formed across the entire top surface of the P/N well 35 producing a recessed top surface 31T' of the P/N well 35. As stated above, the combination of the P/N well 35 and the silicide layer 141B form the lower plate 150 of the MIM capacitor 610, and the capacitor HiK dielectric layer 160 is formed on the top surface 141T of the silicide layer 141B. The top plate electrode 142 of the MIM capacitor 510 is formed on the top surface 160T of the HiK dielectric layer 160 above the silicide layer 141B and the doped P/N well 35, i.e. the lower plate 150 of the MIM capacitor 610. An etch stop layer 144 is formed above the top surface 142T of the top plate electrode 142.

In detail, FIG. 6A shows a semiconductor device 601 which is a portion of the semiconductor device 30 of FIG. 2F in a later stage of manufacturing comprising a P-doped semiconductor substrate 601 manufactured in accordance with the steps from step 176 to step 86 shown in the flow chart of FIG. 6B, which shows the sequence of preliminary steps performed to manufacture the semiconductor device 601 including at least the process steps from step 73 to step 75 shown in FIGS. 2A-2E and FIG. 3. The semiconductor device 601 is formed in and on the doped P/N well 35 (with or without the STI region 33 formed in steps 71-72 in FIG. 5B.)

As indicated above, the semiconductor device 601 has been formed in part within the P/N well 35 in the semiconductor substrate 31 of FIG. 2E and in part above the top surface thereof.

Figure 6B:
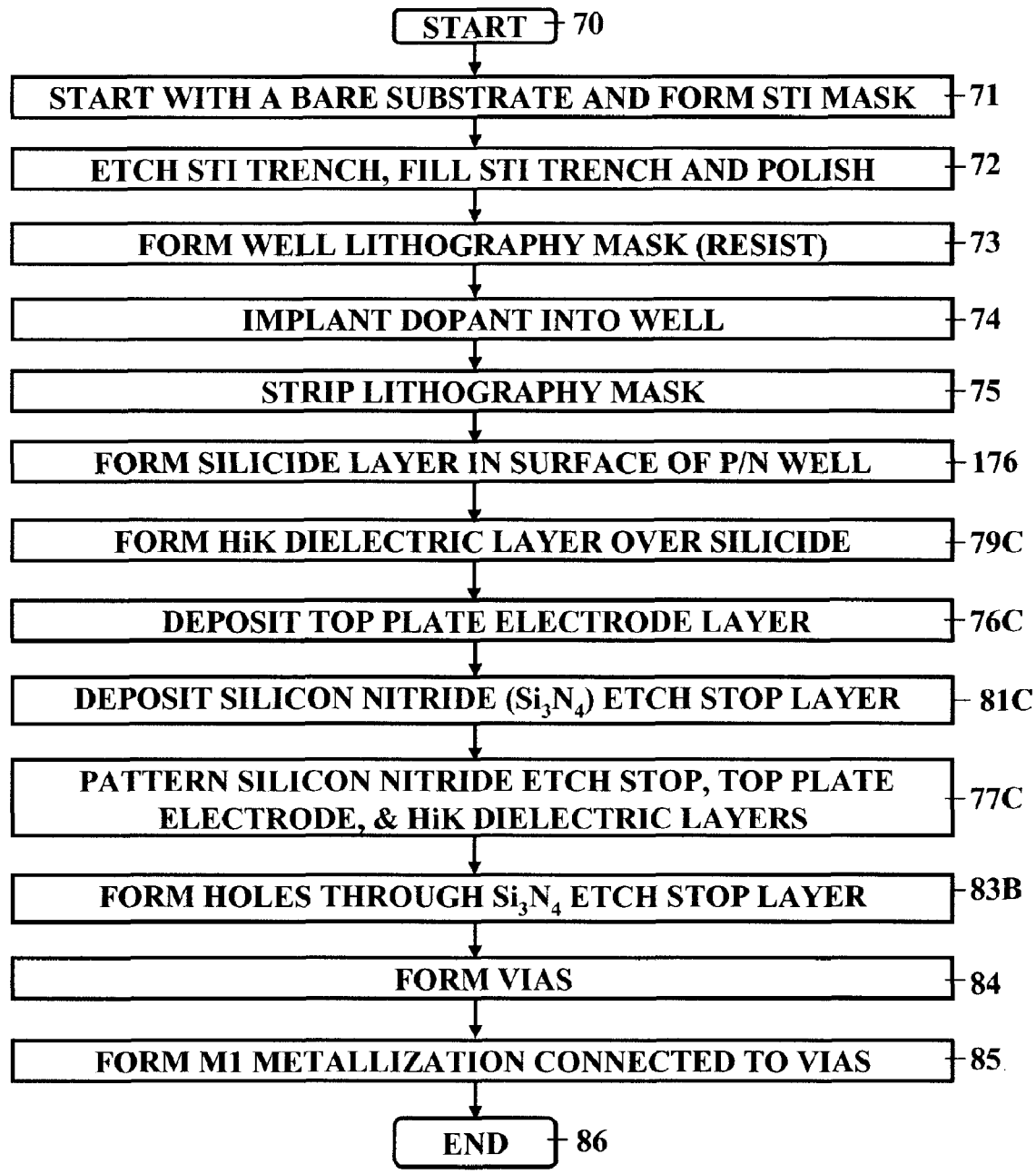
FIG. 6B is a flow chart of the process of manufacturing of the semiconductor device of FIG. 6A in accordance with the method of this invention.

In step 176 of FIG. 6B, a silicidation process is performed forming a silicide layer 141B in the upper surface of the P/N well 35 of FIG. 6A completing the formation of the lower plate 150 of the MIM capacitor 610.

In step 79C of FIG. 6B a blanket HiK dielectric layer 160 composed of a High-K dielectric material, i.e. $Ta_2O_5$, BaTiO$_3$, HfO$_2$, ZrO$_2$ or Al$_2$O$_3$, is deposited on the top surface 141T of the silicide layer 141B (above doped P/N well 35) and on the top surface 31T of the silicon substrate 31 to prepare for formation of the High-K dielectric of the MIM capacitor 610.

In deposition step 76C, of FIG. 6B, a blanket conductive electrode layer 142 has been formed covering the top surface 160T of the dielectric layer 160 and every other exposed surface of the device in preparation for formation of the top plate electrode 142. The processing can be the conventional process for forming Metal gates of MOSFET devices, as will be well understood by those skilled in the art.

In step 81C of FIG. 6B, a blanket silicon nitride (Si$_3$N$_4$) etch stop layer 144 is deposited on the top surface of the blanket MIM top electrode layer 142.

In step 77C a patterning mask (not shown) is formed over the blanket silicon nitride (Si$_3$N$_4$) etch stop layer 144, the blanket conductive electrode layer 142, and the HiK dielectric layer 160. Then the peripheral portions of etch stop layer 144, the blanket conductive electrode layer 142, and the HiK dielectric layer 160 are removed by etching to re-expose the peripheral portions of the top surface 141T of the silicide layer 141B and the top surface 31T of the silicon substrate 31 leaving a patterned top plate electrode 142 and a patterned HiK dielectric layer 160 for the MIM capacitor 610 with sufficient surface area on the top surface 141T of the periphery of the silicide layer 141B exposed for contact, with vias 145T. The etching of the layers 144, 142, and 160 forms sidewalls 142S aligned as those in FIG. 5A. In other words, the sidewalls 142S of the poly silicon layer 142 of the top plate 142 are spaced laterally (recessed) away from the exposed top surface 31T of the silicon substrate 31.

Then in a conventional step 83B in FIG. 6B, after a blanket dielectric layer 149 was formed over the device 501, a set of shallow via holes 53 is formed extending down through the silicon nitride (Si$_3$N$_4$) etch stop layer 144 by patterning the blanket dielectric layer 149 and the silicon nitride (Si$_3$N$_4$) etch stop layer 144. Extra deep via holes 57 are formed reaching down to the silicide layer 141B. The via holes 53 and 57 are formed by first depositing the blanket dielectric layer 149 composed of a material such as BSPG (not shown for convenience of illustration.) Then a via mask is formed and the extra, deep via holes 57 are formed extending through the dielectric layer 149 extending down to the top surface of the silicide layer 141B. In addition the shallow via holes 53 are formed between the sidewalls 142S of the MIM top plate electrode 142 extending through dielectric layer 149 and etch stop layer 144 into contact with the top surface 142T of the MIM top plate electrode 142.

Then in accordance with the conventional via formation step 84 in FIG. 6B, a short pair of vias 147L are formed in the shallower set of via holes 53 extending down to the top surface 142T of the MIM top plate electrode 142. A tall set of vias 145T are formed in the deep set of via holes 57 extending down to the top surface of the silicide layer 141B.

Then in step 85 of FIG. 6B, M1 metallization elements 146/148 are formed above the vias 145T/147L.

Finally, step 86 ends the process shown by FIG. 6B.

Fifth Embodiment

Figure 7A:
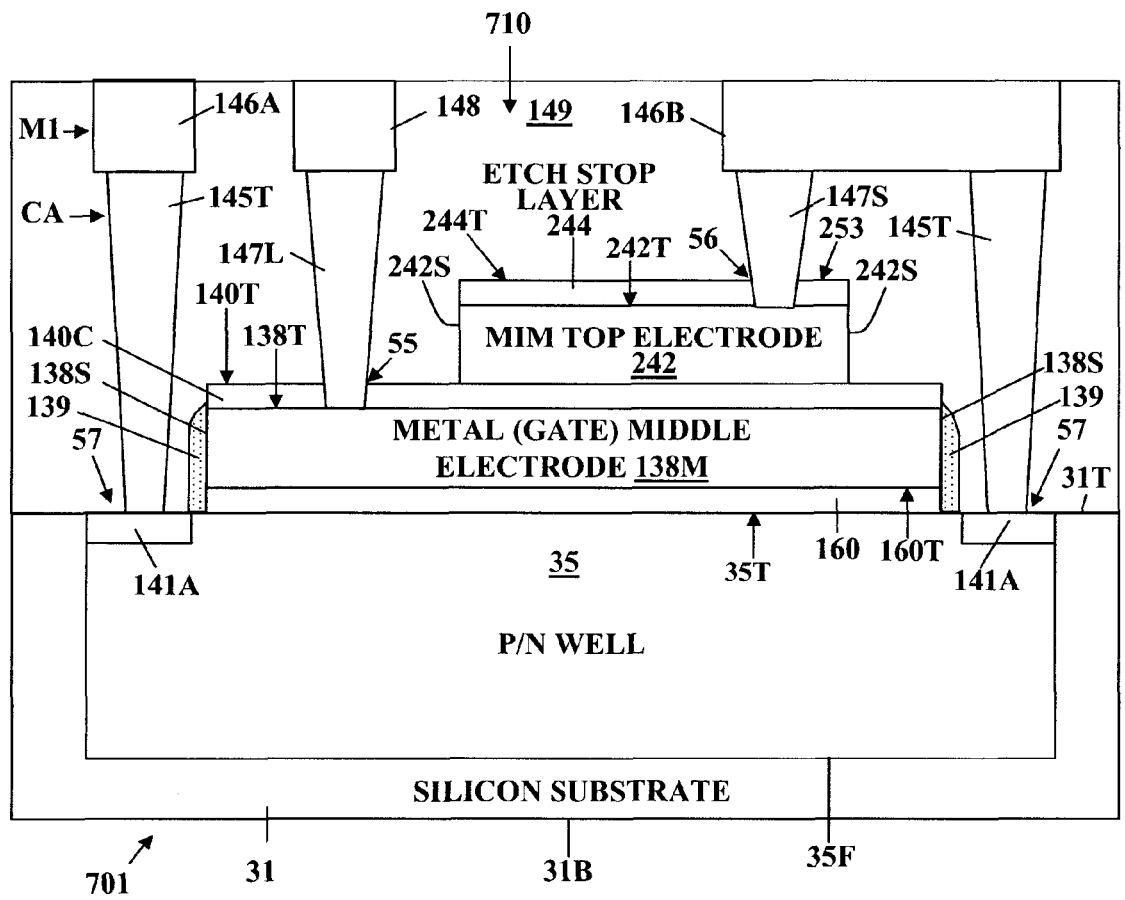
FIG. 7A is schematic sectional view of a semiconductor device in accordance with a fifth embodiment of this invention.

FIG. 7A is schematic sectional view of a semiconductor device 701 including a dual MIM capacitor 710 in accordance with this invention. The semiconductor device 701 is manufactured in accordance with the process of this invention shown by the flow chart of FIG. 7B.

As shown in FIG. 7A the dual MIM capacitor 710 is formed in and on a base of the semiconductor substrate 31 which has a top surface 31T. As with FIG. 5A, a P/N well 35 is formed in a region of the surface 31T of the substrate 31, with the P/N well 35 serving as the entire lower plate of the dual MIM capacitor 710. The P/N well 35 has a top surface 35T coplanar with the top surface 31T of the semiconductor substrate 31. A first HiK dielectric layer 160 is formed on the top surface 35T of the P/N well 35. A middle electrode 138M formed of metal (e.g. the gate electrode layer of the device) is formed directly upon the top surface of the first HiK dielectric layer 160. A second HiK dielectric layer 140C is formed on the top surface 138T of the middle electrode 138M. The top plate electrode 242 is formed on the fop surface 140T of the second HiK dielectric layer 140 above the doped P/N well 35, i.e. the lower plate 35. An etch stop layer 244 is formed above the top plate electrode 242. The lower plate 35 of the MIM capacitor 710 is electrically connected to the top plate 242 of the MIM capacitor. Thus, dual MIM-metal/HiK gate integration is provided.

In detail, FIG. 7A shows a semiconductor device 701 which is a portion of the semiconductor device 30 of FIG. 2F in a later stage of manufacturing comprising a P-doped semiconductor substrate 701 manufactured according to the steps 76D-86 shown in the flow chart of FIG. 7B, which shows the sequence of preliminary steps performed to manufacture the semiconductor device 701 including at least the process step 73-75 shown in FIGS. 2A-2E. Semiconductor device 701 is formed in and on the doped P/N well 35 (with or without the STI region 33 formed in steps 71-72 in FIG. 5B.)

As indicated above, the semiconductor device 701 has been formed in and above the P/N well 35 in the semiconductor substrate 31 of FIG. 2E and above the top surface thereof.

Figure 7B:
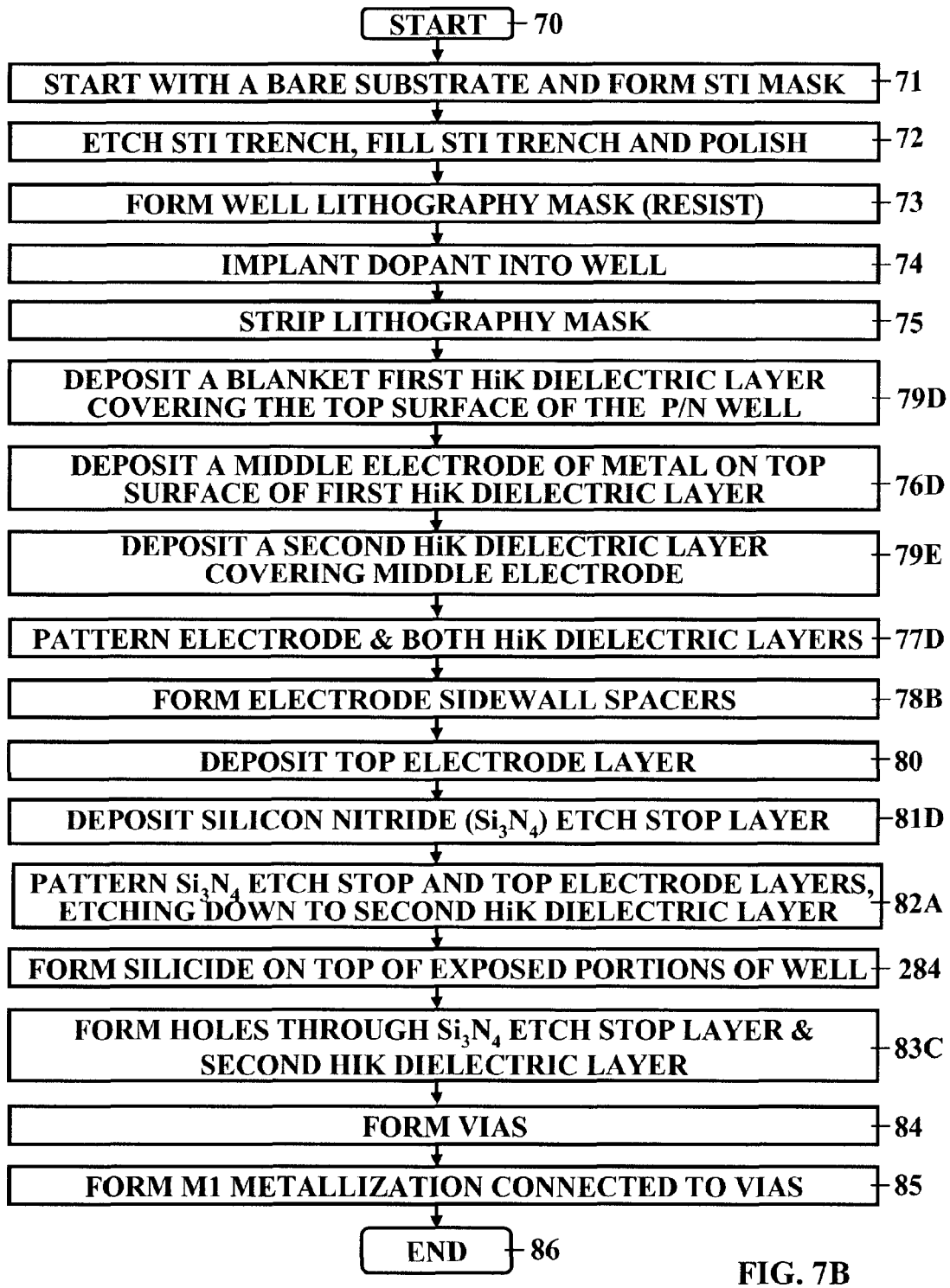
FIG. 7B is a flow chart of the process of manufacturing of the semiconductor device of FIG. 7A in accordance with the method of this invention.

In step 79D of FIG. 7B, a blanket first High-K dielectric layer 160 which is composed of a High-K dielectric material, i.e. Ta$_2$O$_5$, BaTiO$_3$, HfO$_2$, ZrO$_2$ or Al$_2$O$_3$, is deposited on the top surface 35T of the doped P/N well 35 and on the top surface 31T of the substrate 31 to prepare for patterning of the High-K dielectric layer 160 of the MIM capacitor 710.

In deposition step 76D, of FIG. 7B, a blanket conductive metal (gate) middle electrode 138M is deposited covering the top surface 160T of the first High-K dielectric layer 160 and every other exposed surface of the device in preparation for formation of the metal middle electrode 138M. The processing can be the conventional process for forming Metal gates of MOSFET devices, as will be well understood by those skilled in the art.

In step 79E of FIG. 7B, a blanket second High-K dielectric layer 140 having a top surface HOT is deposited covering the top surface 138T of the middle electrode 138M and the remainder of the exposed surfaces of device 701.

In step 77D a middle electrode stack mask (not shown) is formed over the top surface HOT of the second High-K dielectric layer 140 for patterning all of the second High-K dielectric layer 140, the conductive metal (gate) middle electrode 138M and first High-K dielectric layer 160 followed by etching. The etching of the layers 140, 138M, and 160 forms a middle electrode stack with sidewalls 138S aligned as those in FIG. 5A. In other words, the sidewalls 138S of the middle electrode stack are spaced laterally (recessed) away from the exposed top surface 31T of the silicon substrate 31. Then the middle electrode stack mask is removed.

In step 78B of FIG. 7B, sidewall spacers 139 composed of a dielectric material such as silicon dioxide (SiO$_2$) are formed covering the sidewalls 138S of the top plate electrode 138 and the first High-K dielectric layer 160.

In step 80, of FIG. 7B, a blanket conductive top electrode layer 242 has been deposited covering the top surface HOT second High-K dielectric layer HOC and every other exposed surface of the device in preparation for formation of the top plate electrode 242.

In step 81D of FIG. 7B, a blanket silicon nitride ($Si_3N_4$) etch stop layer 244 with a top surface 244T is deposited on the top surface 242T of the blanket MIM top electrode layer 242.

In step 82A in FIG. 7B a second patterning mask (not shown) is formed over the blanket silicon nitride ($Si_3N_4$) etch stop layer 244, the blanket conductive electrode layer 242. Then the peripheral portions of the etch stop layer 244 and the blanket conductive electrode layer 242 are removed by etching to re-expose the peripheral portions of the top surface HOT of second High-K dielectric layer HOC and the top surface 35T of the well 35 and the top surface 31T of the silicon substrate 31 leaving a patterned structure 253 comprising the top plate electrode 242 and a patterned etch stop layer 244 for the MIM capacitor 710 with sufficient surface area on the top surface HOT of the periphery of the second High-K dielectric layer HOC exposed for contact with a via 147L. The etching of the layers 244 and 242 forms sidewalls 242S having an alignment recessed inside of the vertical planes of sidewalls 138S of the middle electrode 138M. In other words, the sidewalls 242S of the polysilicon layer 242 of the top plate electrode 242 are spaced away from the exposed top surface HOT of the periphery of the second High-K dielectric layer 140C.

In step 284 in FIG. 7B silicide contacts 141A are formed on top of exposed portions of the P/N well 35 aside from the spacers 139, as in FIGS. 5A/5B.

Then in a conventional step 83C in FIG. 7B, after a blanket dielectric layer 149 was formed over the device 501, a shallow via hole 56 is formed extending down to the top surface 242T of the top electrode 242 through the silicon nitride ($Si_3N_4$) etch stop layer 244 by patterning the blanket, dielectric layer 149 and the silicon nitride ($Si_3N_4$) etch stop layer 244. A deeper via hole 55 is formed reaching down through the dielectric layer 149 and the second High-K dielectric layer HOC to the top surface 138T of the middle electrode 138M. Two extra deep via holes 57 are formed reaching down to the silicide contacts 141A. The via holes 55, 56, and 57 are formed by first forming the blanket deposit of the dielectric layer 149 composed of a material such as BSPG (not shown for convenience of illustration.) Then a via mask is formed and the extra deep via holes 57 are formed extending through the blanket dielectric layer 149 extending down to the top surface of the silicide contacts 141A. The shallow via hole 56 is formed between the sidewalls 242S of the MIM top plate electrode 242 extending to the top surface 242T of the top electrode 242 through layer 149 and etch stop layer 244 into contact with the top surface 242T of the MIM top plate electrode 242. The via hole 55 is formed between the sidewalls 138S of the MIM middle electrode 138M extending through layer 149 and layer 140 into contact with the top surface 138T of the middle electrode 138M.

Then in accordance with the conventional via formation step 84 in FIG. 7B, a short via 147S is formed in the shallow via hole 56 extending down to the top surface 242T of the MIM top plate electrode 242. A tall set of vias 145T are formed in the deep set of via holes 57 extending down to the top surface of the silicide layer 141A. A long via 147L is formed in the via hole 55 extending down to the top surface 138T of the middle electrode 138M.

Finally in step 85 of FIG. 7B, M1 metallization element 146A is formed above the leftmost of the vias 145T, M1 metallization element 148 is formed above the long via 147L, and M1 metallization element 146B is formed above the short via 147S and the rightmost one of the tall vias 145T.

Step 86 ends the process shown by FIG. 7B.

Sixth Embodiment

Figure 8A:
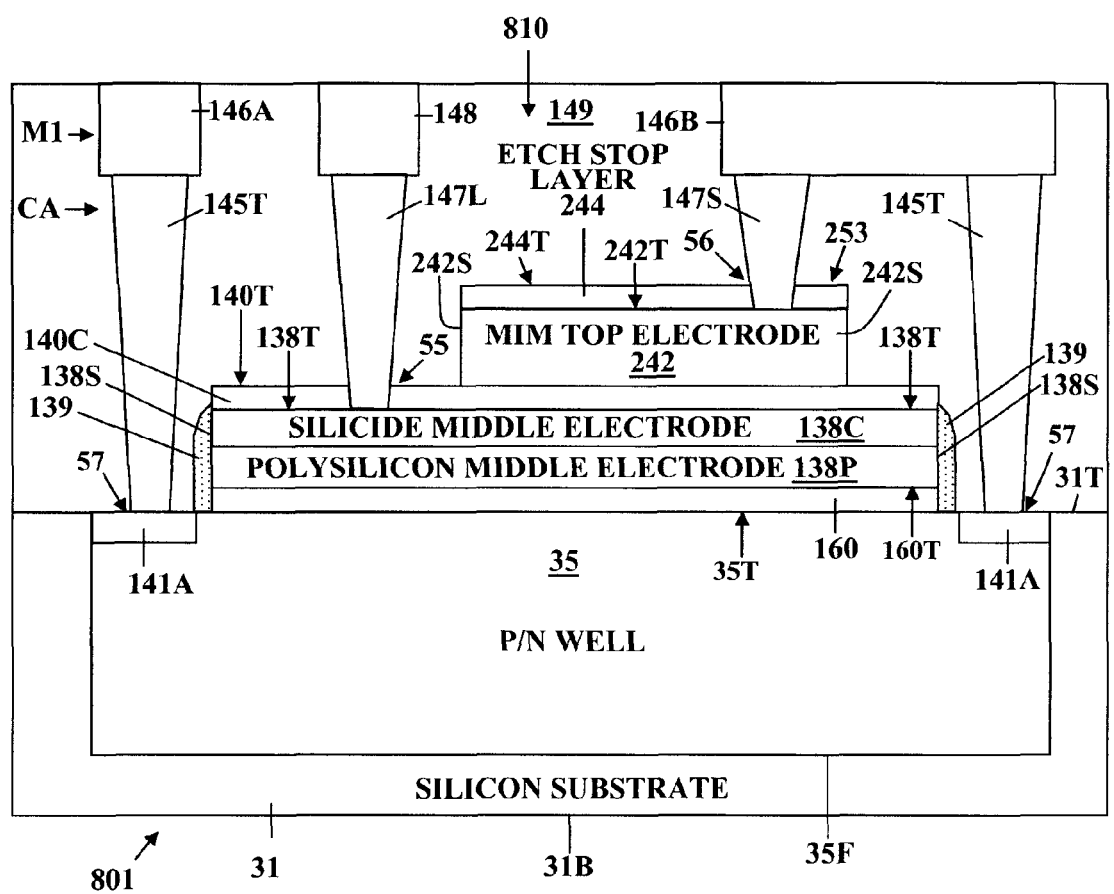
FIG. 8A is schematic sectional view of a semi conductor device in accordance with a sixth embodiment this invention.

FIG. 8A is schematic sectional view of a semiconductor device 801 including a dual MIM capacitor 810 in accordance with this invention. The semiconductor device 801 is manufactured in accordance with the process of this invention shown by the flow chart of FIG. 8B.

As shown in FIG. 8A the dual MIM capacitor 810 is formed in and on a base of the semiconductor substrate 31 with a top surface 31T. As with FIG. 5A, a P/N well 35 is formed in a region of the surface 31T of the substrate 31, with the P/N well 35 serving as the entire lower plate of the dual MIM capacitor 810. The P/N well 35 has a top surface 35T coplanar with the top surface 31T of the semiconductor substrate 31. A first HiK dielectric layer 160 is formed on the top surface 35T of the P/N well 35. A poly silicon middle electrode layer 138P capped with a silicide middle electrode layer 138C is formed directly upon the top surface 160T of the first HiK dielectric layer 160. A second HiK dielectric layer 140C is formed on the top surface 138T of the silicide middle electrode layer 138C. The top plate electrode 242 is formed on the top surface HOT of the second HiK dielectric layer 140 above the doped P/N well 35, i.e. the lower plate 35. An etch stop layer 244 is formed above the top plate electrode 242. The lower plate 35 of the MIM capacitor 810 is electrically connected to the top plate 242 of the MIM capacitor 810. Thus, dual MIM-metal/HiK gate integration is provided.

In detail, FIG. 8A shows a semiconductor device 801 which is a portion of the semiconductor device 30 of FIG. 2F in a later stage of manufacturing comprising a P-doped semiconductor substrate 801 manufactured according to the steps 79D-86 shown in the flow chart of FIG. 8B, which shows the sequence of preliminary steps performed to manufacture the semiconductor device 801 including at least the process steps from step 73 to step 75 shown in FIGS. 2A-2E and FIG. 3. Semiconductor device 801 is formed in and on the doped P/N well 35 (with, or without the STI region 33 formed in steps 71-72 in FIG. 5B.)

As indicated above, the semiconductor device 801 has been formed in and above the P/N well 35 in the semiconductor substrate 31 of FIG. 2E and above the top surface thereof.

Figure 8B:
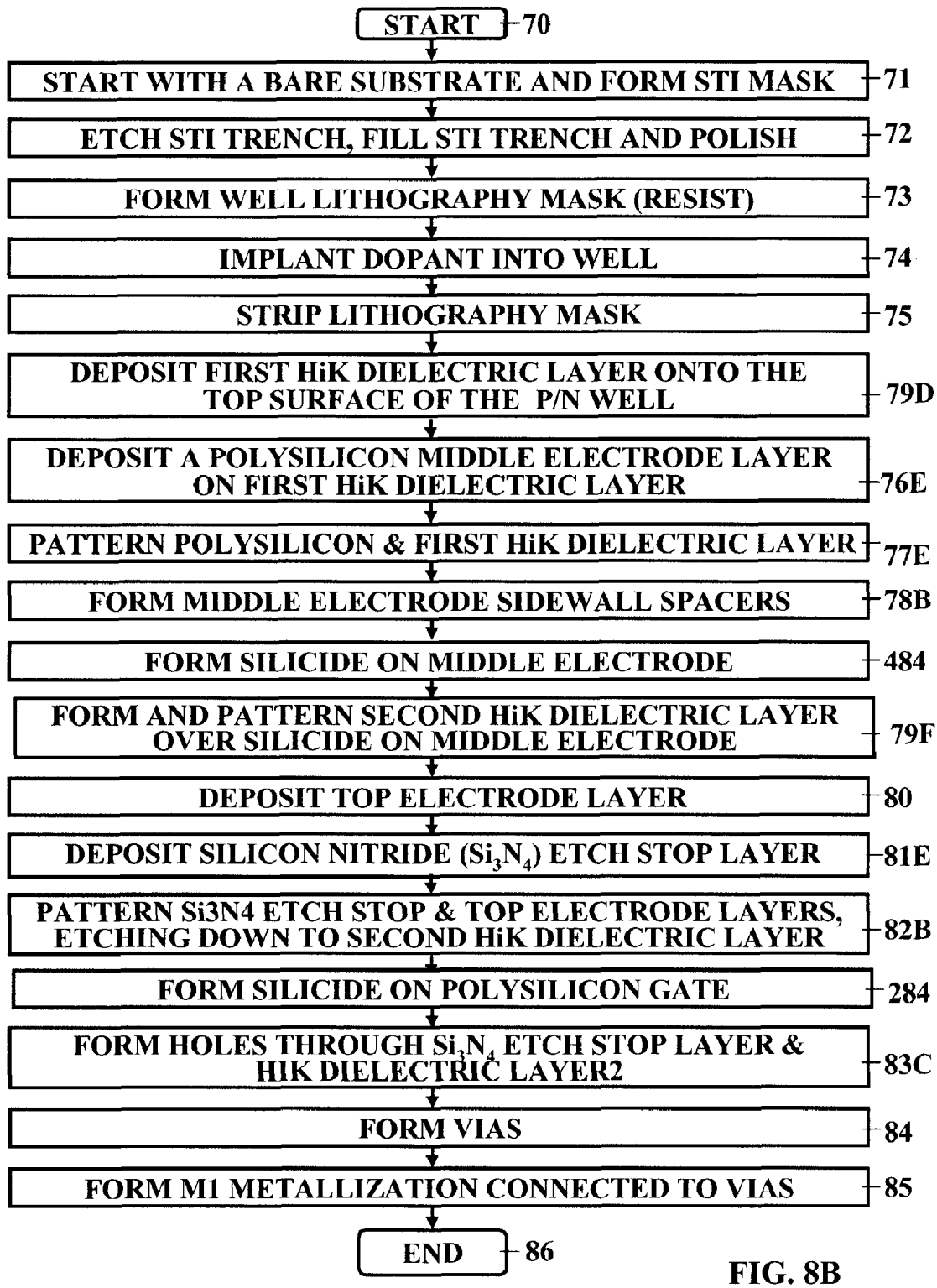
FIG. 8B is a flow chart of the process of manufacturing of the semiconductor device of FIG. 8A in accordance with the method of this invention.

In step 79D of FIG. 8B, a blanket first High-K dielectric layer 160 with a top surface 160T, which is composed of a High-K dielectric material, i.e. $Ta_2O_5$, $BaTiO_3$, $HfO_2$, $ZrO_2$ or $Al_2O_3$, is deposited on the top surface 35T of the doped P/N well 35 and on the top surface 31T of the 31 to prepare for patterning of the High-K dielectric layer 160 of the MIM capacitor 810.

In deposition step 76E, of FIG. 5B, a blanket polysilicon middle electrode layer 138P is deposited covering the top surface 160T of the first High-K dielectric layer 160 and every other exposed surface of the device in preparation for formation of the middle electrode 138P/138C. The processing can be the conventional process for forming Metal gates of MOSFET devices, as will be well understood by those skilled in the art.

In step 77E a middle electrode stack mask (not shown) is formed over the top surface 138T of the polysilicon middle electrode layer 138P for patterning both of the layer 138P and first High-K dielectric layer 160 followed by etching. The etching of the layers 138P and 160 forms a middle electrode stack 138P/160 with sidewalls 138S aligned as those in FIG. 5A. In other words, the sidewalls 138S of the middle electrode stack 138P/160 are spaced laterally (recessed) away from the exposed top surface 31T of the silicon substrate 31. Then the mask used to pattern the middle electrode stack is removed.

In step 78B of FIG. 8B, sidewall spacers 139 composed of a dielectric material such as silicon dioxide (SiO$_2$) are formed covering the sidewalls 138S of the middle electrode 138P and the first High-K dielectric layer 160.

In step 484 of FIG. 8B, a silicidation process is performed forming a silicide layer 138P in the upper surface of the polysilicon middle electrode layer 138P of FIG. 8A completing the formation of the middle electrode plate 138P of the MIM capacitor 810.

In step 79F of FIG. 8B, a blanket second High-K dielectric layer HOC having a top surface HOT is deposited covering the top surface 138T of the middle electrode 138C/138P and the remainder of the exposed surfaces of device 801.

In step 80, of FIG. 8B, a blanket conductive top electrode layer 242 has been deposited, covering the top surface HOT of the second High-K dielectric layer 140C and every other exposed surface of the device in preparation for formation of the top plate electrode 242.

In step 81E of FIG. 8B, a blanket silicon nitride (Si$_3$N$_4$) etch stop layer 244 with a top surface 244T is deposited on the top surface of the blanket MIM top electrode layer 242.

In step 82B in FIG. 8B a second patterning mask (not shown) is formed over the blanket silicon nitride (Si$_3$N$_4$) etch stop layer 244 and the blanket conductive electrode layer 242. Then the peripheral portions of the etch stop layer 244 and the blanket conductive electrode layer 242 are removed by etching to re-expose the peripheral, portions of the top surface HOT of second High-K dielectric layer HOC and the top surface 35T of the well 35 and the top surface 31T of the silicon substrate 31 leaving a patterned structure 253 comprising the top plate electrode 242 and a patterned etch stop layer 244 for the MIM capacitor 810 with sufficient surface area on the top surface 140T of the periphery of the second High-K dielectric layer HOC exposed for contact with a via 147L. The etching of the layers 244 and 242 forms sidewalls 242S having an alignment recessed inside of the vertical planes of sidewalls 138S of the middle electrode 138C/138P. In other words, the sidewalls 242S of the polysilicon layer 242 of the top plate electrode 242 are spaced away from the exposed top surface 140T on the periphery of the second High-K dielectric layer 140C.

In step 284 in FIG. 8B silicide contacts 141A are formed on top of exposed portions of the P/N well 35 aside from the spacers 139 as in FIGS. 5A/5B and 7A/7B.

Then in a conventional step 83C in FIG. 8B, after a blanket dielectric layer 149 was formed over the device 501, a shallow via hole 56 extending to the top surface 242T of the top electrode 242 is formed extending down through the silicon nitride (Si$_3$N$_4$) etch stop layer 144 by patterning the blanket dielectric layer 149 and the silicon nitride (Si$_3$N$_4$) etch stop layer 244. A deeper via hole 55 is formed reaching down through the dielectric layer 149 and the second High-K dielectric layer HOC to the top surface 138T of the middle electrode 138C/138P. Two extra deep via holes 57 are formed reaching down to the silicide contacts 141A. The via holes 55, 56, and 57 are formed by first forming the blanket deposit of the dielectric layer 149 composed of a material such as BSPG (not shown for convenience of illustration.) Then a via mask is formed and the extra deep via holes 57 are formed extending through the blanket dielectric layer 149 extending down to the top surface of the silicide contacts 141A. The shallow via hole 56 is formed between the sidewalls 242S of the MIM top plate electrode 242 extending through layer 149 and etch stop layer 244 into contact with the top surface 242T of the MIM top plate electrode 242. The via hole 55 is formed between the sidewalls 138S of the MIM middle electrode 138C/138P extending through layer 149 and layer 140 into contact with the top surface 138T of the middle electrode 138C/138P.

Then in accordance with the conventional via formation step 84 in FIG. 8B, a short via 147S is formed in the shallow via hole 56 extending down to the top surface 242T of the MIM top plate electrode 242. A tall set of vias 145T are formed in the deep set of via holes 57 extending down, to the top surface of the silicide layer 141A. A long via 147L is formed in the via hole 55 extending down to the top surface 138T of the middle electrode 138C/138P.

Finally in step 85 of FIG. 8B, M1 metallization element 146A is formed above the leftmost one of the vias 145T, M1 metallization element 148 is formed above the long via 147L, and M1 metallization element 146B is formed above the short via 147S and the rightmost one of the tall vias 145T.

Step 86 ends the process shown by FIG. 8B.

Seventh Embodiment

Figure 9A:
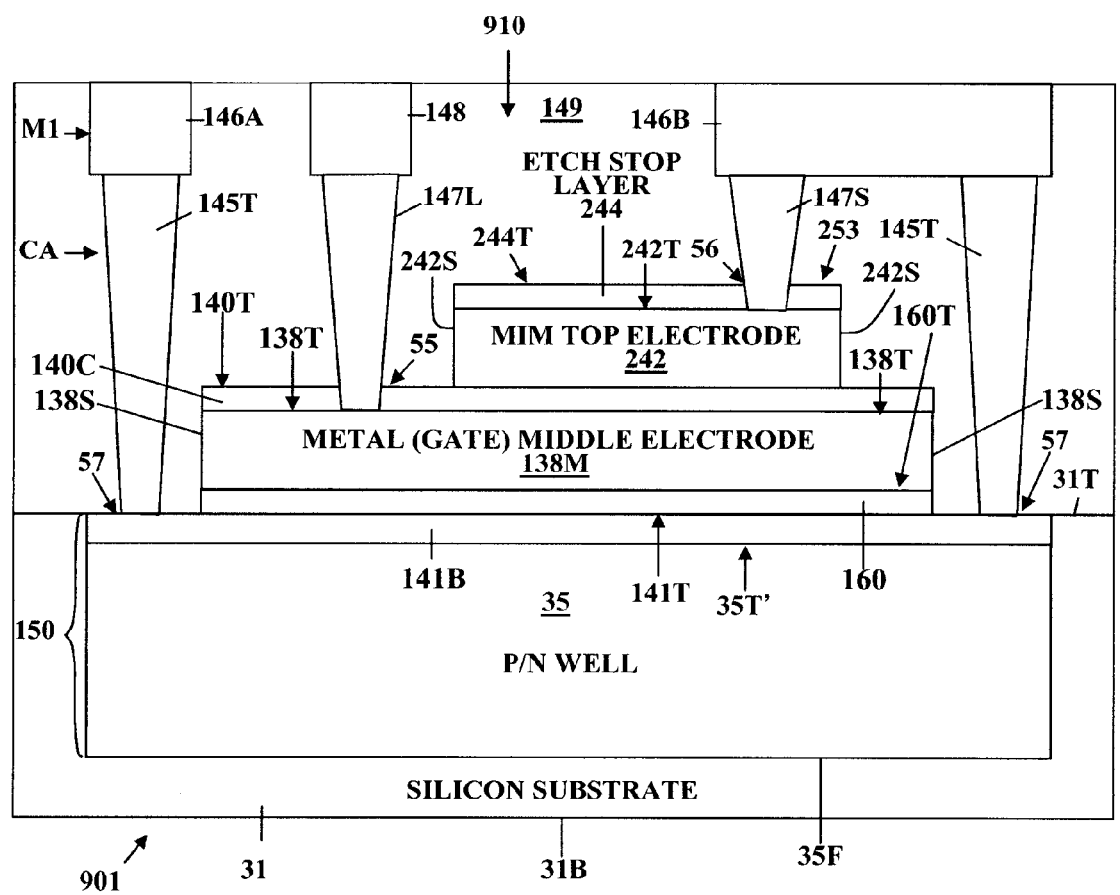
FIG. 9A is schematic sectional view of a semiconductor device in accordance with a seventh embodiment of this invention.

FIG. 9A is schematic sectional view of a semiconductor device 901 including a dual MIM capacitor 910 in accordance with this invention. The semiconductor device 901 is manufactured in accordance with the process of this invention shown by the flow chart of FIG. 9B.

Referring to FIG. 9A, the MIM capacitor 910 includes a P/N doped well 35 formed in a region of the surface 31T of the substrate 31, with the doped P/N well 35 capped with a silicide layer 141B extending across the entire top surface of the P/N well 35 serving as the lower plate 150 of the MIM capacitor 910. The silicide layer 141B has a top surface 35T coplanar with the top surface 31T of the semiconductor substrate 31 with the top surface 35T of the P/N well 35 spaced therebelow. A capacitor HiK dielectric layer 160 is formed on the top surface 141T of the silicide layer 141B. The top plate 242 of the MIM capacitor 910 is formed across the top surface 160T of the HiK dielectric layer 160 above silicide layer 141B and the doped P/N well 35, i.e. the lower plate 150 of the MIM capacitor 910. An etch stop layer 244 is formed above the top plate electrode 242, A HiK dielectric layer 160 is formed on the top surface of the silicide layer 141B above doped well 35 and silicide layer 141B. The top plate electrode 242 of the MIM capacitor 610 is formed on the top surface 160T of the HiK dielectric layer 160. The top plate 142 of the dual MIM capacitor 610 is formed with sidewalls 142S well inside of the location of the periphery of the silicide layer 141B and the P/N well 35.

As shown in FIG. 9A the MIM capacitor 910 is formed on a base comprising a semiconductor substrate 31 having a top surface 31T. The P/N well 35 is formed in a region of the surface 31T of the substrate 31. As in FIG. 6A, the P/N well 35 originally had a top surface coplanar with the top surface 31T of the semiconductor substrate 31, but a silicide layer 141B has been formed extending across the entire top surface of the P/N well 35 producing a recessed top surface 35T of the P/N well 35. As stated above, the combination of the P/N well 35 and the silicide layer 141B form the lower plate 150 of the dual MIM capacitor 910, and the capacitor HiK dielectric layer 160 is formed on the top surface 141T of the silicide layer 141B. The metal (gate) middle electrode 138M of the MIM capacitor 910 is formed on the top surface 160T of the HiK dielectric layer 160 above the silicide layer 141B and the doped P/N well 35, i.e. the lower plate 150 of the MIM capacitor 610. A second HiK dielectric layer HOC is formed on the top surface 138T of the middle electrode layer 138M. The top plate electrode 242 is formed on the top surface HOT of the second HiK dielectric layer 140 above the doped P/N well 35 of the lower plate 150. An etch stop layer 244 is formed above the top plate electrode 242. The lower plate 35 of the MIM capacitor 910 is electrically connected to the top plate 242 of the MIM capacitor 910. Thus, dual MIM-metal/HiK gate integration is provided.

In detail, FIG. 9A shows a semiconductor device 901 which is a portion of the semiconductor device 30 of FIG. 2F in a later stage of manufacturing thereof, comprising a P-doped semiconductor substrate 901 manufactured according to the steps from step 176 to step 86 shown in the Slow chart of FIG. 9B, which shows the sequence of preliminary steps performed to manufacture the semiconductor device 901 including at least the process steps from step 73 to step 75 shown in FIGS. 2A-2E. Semiconductor device 901 is formed in and on the doped P/N well 35 (with or without the STI region 33 formed in steps 71-72 in FIG. 5B.)

As indicated above, the semiconductor device 901 has been formed in and above the P/N well 35 in the semiconductor substrate 31 of FIG. 2E and above the top surface thereof.

Figure 9B:
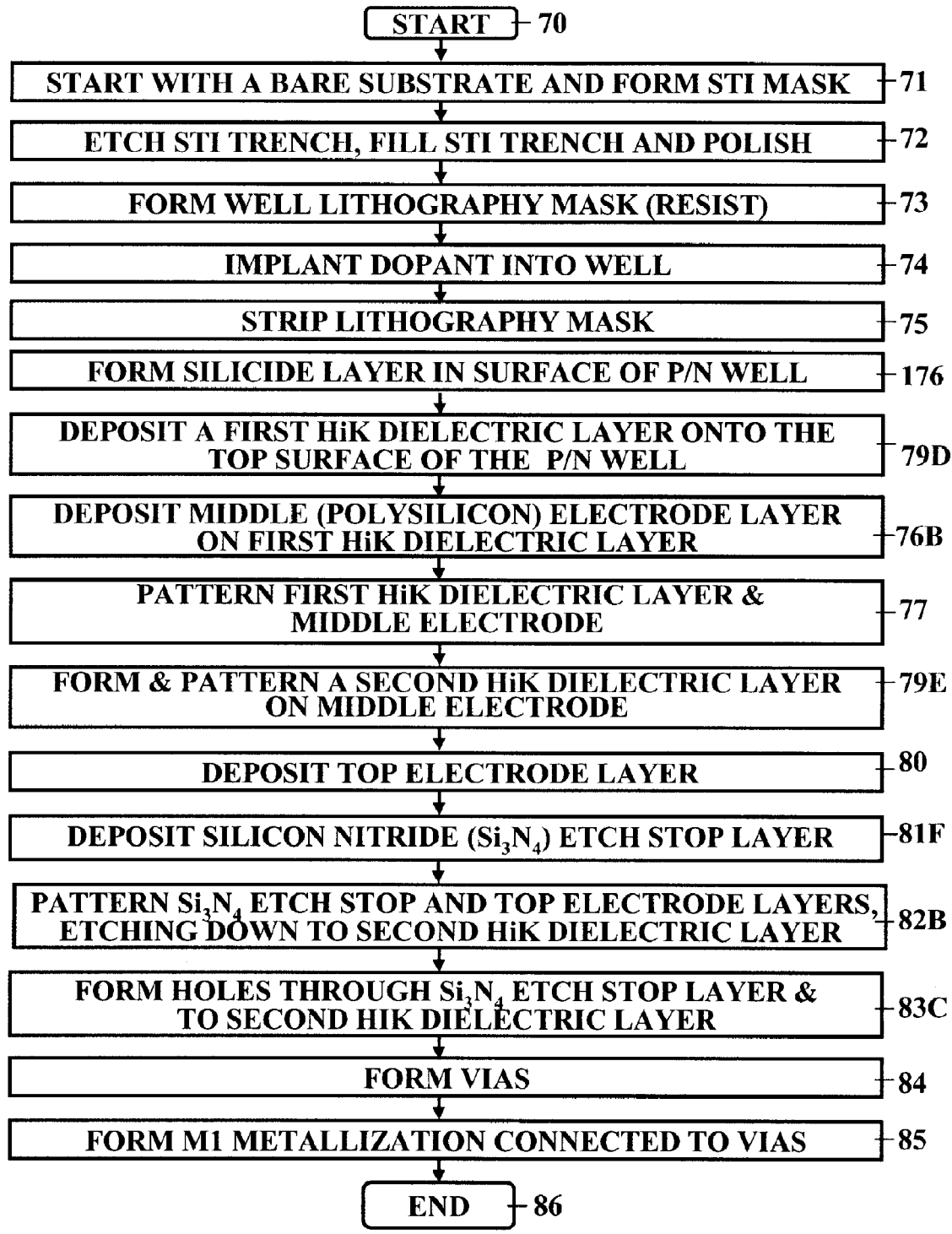
FIG. 9B is a flow chart of the process of manufacturing of the semiconductor device of FIG. 9A in accordance with the method of this invention.

In step 176 of FIG. 9B, a silicidation process is performed forming a silicide layer 141B in the upper surface of the P/N well 35 of FIG. 9A completing the formation of the lower plate 150 of the MIM capacitor 910.

In step 79D of FIG. 9B, a blanket first High-K dielectric layer 160 with a top surface 160T, that is composed of a High-K dielectric material, i.e. $Ta_2O_5$, $BaTiO_3$, $HfO_2$, $ZrO_2$ or $Al_2O_3$, is deposited on the top surface 141T of the silicide layer 141B and on the top surface 31T of the substrate 31 to prepare for patterning the High-K dielectric layer 160 of the MIM capacitor 910.

In deposition step 76B, of FIG. 9B, a blanket polysilicon middle electrode layer 138P is deposited covering the top surface 160T of the first High-K dielectric layer 160 and every other exposed, surface of the device in preparation for formation of the middle electrode 138M. The processing can be the conventional process for forming Metal gates of MOSFET devices, as will be well understood by those skilled in the art.

In step 77 a middle electrode stack mask (not shown) is formed over the top surface 138T of the polysilicon middle electrode layer 138P for patterning both of the layer 138P and first High-K dielectric layer 160 followed by etching. The etching of the layers 138P and 160 forms a middle electrode stack 138M/160 with sidewalls 138S aligned as those in FIG. 5A. In other words, the sidewalls 138S of the middle electrode stack 138M/160 are spaced laterally (recessed) away from the exposed top surface 31T of the silicon substrate 31. Then the mask used to pattern the middle electrode stack is removed.

In step 79E of FIG. 9B, a blanket second High-K dielectric layer HOC having a top surface 140T is deposited covering the top surface 138T of the middle electrode 138M and the remainder of the exposed surfaces of device 901.

In step 80, of FIG. 9B, a blanket conductive top electrode layer 242 has been deposited covering the top surface 140T of the second High-K dielectric layer HOC and every other exposed surface of the device in preparation for formation of the top plate electrode 242.

In step 81F of FIG. 9B, a blanket silicon nitride ($Si_3N_4$) etch stop layer 244 with a top surface 244T is deposited on the top surface of the blanket MIM top electrode layer 242.

In step 82B in FIG. 9B a second patterning mask (not shown) is formed over the blanket silicon nitride ($Si_3N_4$) etch stop layer 244 and the blanket conductive electrode layer 242. Then the peripheral portions of the etch stop layer 244 and the blanket conductive electrode layer 242 are removed by etching to re-expose the peripheral portions of the top surface HOT of second High-K dielectric layer HOC and the top surface 35T of the well 35 and the top surface 31T of the silicon substrate 31 leaving a patterned structure 253 comprising the top plate electrode 242 and a patterned etch stop layer 244 for the MIM capacitor 910 with, sufficient surface area on the top surface HOT of the periphery of the second High-K dielectric layer HOC exposed for contact with a via 147L. The etching of the layers 244 and 242 forms sidewalls 242S recessed inside of the vertical planes of sidewalls 138S of the middle electrode 138M. In other words, the sidewalls 242S of the polysilicon layer 242 of the top plate electrode 242 are spaced away from the exposed top surface HOT on the periphery of the second High-K dielectric layer HOC.

Then in a conventional step 83C in FIG. 9B, after a blanket dielectric layer 149 was formed over the device 501, a shallow via hole 56 extending to the top surface 242T of the top electrode 242 is formed extending down through the silicon nitride ($Si_3N_4$) etch stop layer 144 to the top surface 242T of the top electrode 242 by patterning the blanket dielectric layer 149 and the silicon nitride ($Si_3N_4$) etch stop layer 244. A deeper via hole 55 is formed reaching down through the dielectric layer 149 and the second High-K dielectric layer HOC to the top surface 138T of the middle electrode 138M. Two extra deep via holes 57 are formed reaching down to the silicide contacts 141A. The via holes 55, 56, and 57 are formed by first forming the blanket deposit of the dielectric layer 149 composed of a material such, as BSPG (not shown for convenience of illustration.) Then a via mask is formed and the extra deep via holes 57 are formed extending through the blanket dielectric layer 149 extending down to the top surface of the silicide contacts 141A. The shallow via hole 56 is formed between the sidewalls 242S of the MIM top plate electrode 242 extending through layer 149 and etch stop layer 244 into contact with the top surface 242T of the MIM top plate electrode 242. The via hole 55 is formed between the sidewalks 138S of the MIM middle electrode 138M extending through layer 149 and layer 140 into contact with the top surface 138T of the middle electrode 138M.

Then in accordance with the conventional via formation step 84 in FIG. 9B, a short via 147S is formed in the shallow via hole 56 extending clown to the top surface 242T of the MIM top plate electrode 242. A tall set of vias 145T are formed in the deep set of via holes 57 extending down to the top surface of the silicide layer 141B. A long via 147L is formed in the via hole 55 extending down to the top surface 138T of the middle electrode 138M.

Finally in step 85 of FIG. 9B, M1 metallization element 146A is formed above the leftmost of the vias 145T, M1 metallization element 148 is formed, above the long via 147L, and M1 metallization element 146B is formed above the short via 147S and the rightmost one of the tall vias 145T.

Step 86 ends the process shown by FIG. 9B.

In accordance with this invention a MIM capacitor is formed as part of a CMOS integration circuit device including the a. FET gate layer (i.e. a metal, polysilicon or polysilicon/silicide structure) and a HiK dielectric layer to make a plate of the MIM capacitor.

Advantages of the invention are as follows:
  (a) Provides a capacitor compatible with metal/HiK gate CMOS integration.
  (b) The MIM capacitor has better linearity compared to the current MOS capacitors and hence comprises a better RF device,
  (c) The use of HiK dielectric material provides high capacitance density and is suitable for both decoupling and RF capacitors.

(d) There is no need for BEOL MIM integration, which is increasingly difficult with each new generation because of via height reduction.

While this invention has been described in terms of the above specific embodiments), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

What is claimed is:

1. A method of forming an integrated MIM capacitor, comprising the steps of:
   providing a semiconductor substrate having a top surface;
   forming a lower capacitor plate and a High K (HiK) dielectric layer (160) consisting of a material selected from the group consisting of $Ta_2O_5$, $BaTiO_3$, $HfO_2$, $ZrO_2$, and $Al_2O_3$; by the step comprising:
      (i) forming a doped well (35) in said surface of said semiconductor substrate;
         (a) then forming a silicide region (141B) in said surface of said doped well (35) followed by forming said High K (HiK) dielectric layer (160/40) on said surface of said silicide region (141B); or
         (b) then forming said HiK dielectric layer (160) on said surface of said doped well (35); or
      (ii) forming a Shallow Trench Isolation (STI) region (33) in said semiconductor substrate below said surface of said semiconductor substrate followed by forming a conductor layer (38P) overlying said STI region (33), and
         then followed by forming said HiK dielectric layer (40) over said conductor layer (38P); and
   then forming a second capacitor plate 142 over said HiK dielectric layer (40) above said lower capacitor plate.

2. A method in accordance with claim 1 comprising:
   forming a second capacitor HiK dielectric layer on said second plate electrode; and
   forming a top capacitor plate on said second capacitor HiK dielectric layer above said second plate electrode; and
   connecting said lower capacitor plate electrically to said top capacitor plate;
   whereby a dual capacitor with dual HiK integration is provided.

3. A method of forming an integrated Metal Insulator-Metal (MIM) capacitor on a semiconductor substrate comprising:
   forming a base comprising a semiconductor substrate having a top surface and including regions formed in said surface having exterior surfaces coplanar with said semiconductor substrate selected from the group comprising a doped P/N well and a Shallow Trench Isolation (STI) region;
   forming a lower capacitor plate selected from the group comprising a silicide electrode layer formed in said top surface of said doped P/N well, and a lower electrode formed on top of said STI region in said semiconductor substrate;
   forming a first capacitor High K (HiK) dielectric layer on said lower capacitor plate, and
   forming a second capacitor plate layer patterned into a second capacitor plate on said HiK dielectric layer above said lower capacitor plate.

4. A method in accordance with claim 3 wherein said first capacitor HiK dielectric layer consists of a material selected from the group consisting of $Ta_2O_5$, $BaTiO_3$, $HfO_2$, $ZrO_2$, and $Al_2O_3$.

5. A method in accordance with claim 4 wherein said first capacitor HiK dielectric layer consists of a material selected from the group consisting of $Ta_2O_5$, $BaTiO_3$, $HfO_2$, $ZrO_2$, and $Al_2O_3$.

6. The method of claim 3 wherein:
   said lower capacitor plate comprises a said silicide layer formed in said surface of said substrate in said doped well;
   said first capacitor HiK dielectric layer is formed on said top surface of said silicide layer in said doped well; and
   said capacitor second plate layer is formed on said first capacitor HiK dielectric layer above said lower capacitor plate including said silicide layer in said doped well;
   forming an etch stop layer over said capacitor second plate;
   patterning said etch stop layer, said capacitor second plate layer, and said first and second HiK dielectric layers thereby forming a capacitor second plate;
   forming holes through said etch stop layer;
   forming vias to said lower capacitor plate and a capacitor second plate; and
   forming metallization connected to said vias; and
   said first and second capacitor HiK dielectric layers consist of a material selected from the group consisting of $Ta_2O_5$, $BaTiO_3$, $HfO_2$, $ZrO_2$, and $Al_2O_3$.

7. The method of claim 3 wherein:
   said lower capacitor plate comprises a said silicide layer formed in said top surface of said substrate in said doped well;
   said first HiK dielectric layer is formed on said top surface of said substrate on said silicide layer in said doped well;
   said second capacitor plate comprises an electrode layer formed on said first HiK dielectric layer;
   forming a second capacitor HiK dielectric layer on said second capacitor plate;
   forming a top capacitor plate on said second capacitor HiK dielectric layer over said lower capacitor plate; and
   connecting said lower capacitor plate electrically to said top capacitor plate;
   whereby a dual MIM-metal/HiK gate integration is provided over a region of diffused dopant in said substrate.

8. A method in accordance with claim 7 wherein said first capacitor HiK dielectric layer consists of a material selected from the group consisting of $Ta_2O_5$, $BaTiO_3$, $HfO_2$, $ZrO_2$, and $Al_2O_3$.

9. The method of claim 3 wherein:
   said substrate includes a said STI region;
   said lower electrode formed on top of said STI region is composed of a material selected from the group consisting of a metal layer (38M) and a polysilicon layer (38P) capped with a silicide layer;
   said first capacitor HiK dielectric layer is formed on said lower capacitor electrode; and
   said capacitor second plate is formed on said first capacitor HiK dielectric layer above said lower electrode.

10. A method in accordance with claim 9 wherein said first capacitor HiK dielectric layer consists of a material selected from the group consisting of $Ta_2O_5$, $BaTiO_3$, $HfO_2$, $ZrO_2$, and $Al_2O_3$.

11. The method of claim 3 wherein:
   said lower capacitor plate comprises a said silicide layer formed in said top surface of said substrate in said doped well;

said first HiK dielectric layer is formed on said top surface of said substrate on said silicide layer in said doped well;

said second capacitor plate comprises an electrode layer formed on said first HiK dielectric layer;

forming a second capacitor HiK dielectric layer on said second capacitor plate, patterning said second capacitor plate and said second capacitor HiK dielectric layers to form said second capacitor plate;

forming a top capacitor plate layer on said second capacitor HiK dielectric layer over said lower capacitor plate;

forming an etch stop layer over said top capacitor plate layer;

patterning said etch stop layer and said top capacitor plate layer to form a top capacitor plate;

forming holes through said etch stop layer;

forming vias to said lower capacitor plate, said a capacitor second plate and said top capacitor plate, and forming metallization connected to said vias connecting said lower capacitor plate electrically to said top capacitor plate;

whereby a dual MIM-metal/HiK gate integration is provided over a region of diffused dopant in said substrate.

12. A method in accordance with claim 11 wherein said first capacitor HiK dielectric layer consists of a material selected from the group consisting of $Ta_2O_5$, $BaTiO_3$, $HfO_2$, $ZrO_2$, and $Al_2O_3$.

13. The method of claim 3 wherein steps are performed in the sequence as follows:

forming said lower capacitor plate composed of a metal layer on top of said STI region;

patterning said metal layer to form a lower metal electrode;

forming sidewall spacers on said lower metal electrode;

forming said first HiK dielectric layer is on top of said lower metal electrode;

forming said capacitor second plate on said first HiK dielectric layer;

forming an etch stop layer;

patterning said etch stop layer and said capacitor second plate;

forming vias to said lower capacitor plate and said capacitor second plate, and forming metallization connected to said vias.

14. A method in accordance with claim 13 wherein said first capacitor HiK dielectric layer consists of a material selected from the group consisting of $Ta_2O_5$, $BaTiO_3$, $HfO_2$, $ZrO_2$, and $Al_2O_3$.

15. The method of claim 3 wherein steps are performed in the sequence as follows:

forming said lower electrode composed of polysilicon on top of said STI region;

said first HiK dielectric layer is formed on top of said first electrode with a silicide layer formed on top of a polysilicon layer which is formed on top of said STI regions;

said capacitor second plate is formed on said first HiK dielectric layer;

forming a second capacitor HiK dielectric layer on said capacitor second plate;

forming a top capacitor plate on said second capacitor HiK dielectric layer over said lower capacitor plate including said silicide layer and said doped polysilicon layer; and connecting said lower capacitor plate electrically to said top capacitor plate;

whereby said lower capacitor plate comprises a said lower electrode composed of silicided polysilicon formed on top of said STI region.

16. A method in accordance with claim 15 wherein said first capacitor HiK dielectric layer consists of a material selected from the group consisting of $Ta_2O_5$, $BaTiO_3$, $HfO_2$, $ZrO_2$, and $Al_2O_3$.

17. The method of claim 11 wherein:

said substrate includes a said STI region;

said lower capacitor plate comprises a silicided, doped polysilicon layer formed on said STI region; and said first capacitor HiK dielectric layer is formed on said lower capacitor plate; and said top capacitor plate is formed on said first capacitor HiK dielectric layer above said silicide layer and said polysilicon layer.

18. The method of claim 17 wherein said lower capacitor plate comprises a silicided, doped polysilicon layer formed on said STI region.

19. A method in accordance with claim 18 wherein said first capacitor HiK dielectric layer consists of a material selected from the group consisting of $Ta_2O_5$, $BaTiO_3$, $HfO_2$, $ZrO_2$, and $Al_2O_3$.

* * * * *